United States Patent
Yalamarthy et al.

(10) Patent No.: US 11,330,739 B2
(45) Date of Patent: May 10, 2022

(54) CENTRALLY ANCHORED MEMS-BASED ACTIVE COOLING SYSTEMS

(71) Applicant: Frore Systems Inc., San Jose, CA (US)

(72) Inventors: Ananth Saran Yalamarthy, Stanford, CA (US); Suryaprakash Ganti, Los Altos, CA (US); Vikram Mukundan, San Ramon, CA (US); Seshagiri Rao Madhavapeddy, La Jolla, CA (US); Prabhu Sathyamurthy, San Jose, CA (US); Narayana Prasad Rayapati, Mountain View, CA (US)

(73) Assignee: Frore Systems Inc., San Jose, CA (US)

( * ) Notice: Subject to any disclaimer, the term of this patent is extended or adjusted under 35 U.S.C. 154(b) by 0 days.

(21) Appl. No.: 16/915,912

(22) Filed: Jun. 29, 2020

(65) Prior Publication Data
US 2021/0176894 A1 Jun. 10, 2021

Related U.S. Application Data

(60) Provisional application No. 62/945,001, filed on Dec. 6, 2019.

(51) Int. Cl.
| | | |
|---|---|---|
| H05K 7/20 | (2006.01) | |
| B81B 7/00 | (2006.01) | |
| H01L 41/047 | (2006.01) | |
| H01L 41/04 | (2006.01) | |

(52) U.S. Cl.
CPC ....... H05K 7/20509 (2013.01); B81B 7/0093 (2013.01)

(58) Field of Classification Search
CPC . H05K 7/20509; B81B 7/0093; H01L 41/042; H01L 41/047
See application file for complete search history.

(56) References Cited

U.S. PATENT DOCUMENTS

| | | | | |
|---|---|---|---|---|
| 4,450,505 A | | 5/1984 | Mittal | |
| 4,595,338 A | * | 6/1986 | Kolm | F04D 33/00 310/330 |
| 4,751,713 A | * | 6/1988 | Affleck | H01S 3/036 372/59 |
| 4,780,062 A | | 10/1988 | Yamada | |
| 4,834,619 A | * | 5/1989 | Walton | F04D 33/00 416/81 |

(Continued)

FOREIGN PATENT DOCUMENTS

TW 200635493 10/2006

OTHER PUBLICATIONS

Murata Manufacturing Co., Ltd., Microblower MZB1001T02, Microblower (Air Pump), Micro Mechatronics, Apr. 2014, downloaded from https://www.murata.com/en-us/products/mechatronics/fluid/microblower_mzb1001t02.

(Continued)

*Primary Examiner* — Anatoly Vortman
(74) *Attorney, Agent, or Firm* — Van Pelt, Yi & James LLP

(57) ABSTRACT

A cooling system is described. The cooling system includes a cooling element having a central region and a perimeter. The cooling element is anchored at the central region. At least a portion of the perimeter is unpinned. The cooling element is in communication with a fluid. The cooling element is actuated to induce vibrational motion to drive the fluid toward a heat-generating structure.

15 Claims, 14 Drawing Sheets

(56) References Cited

U.S. PATENT DOCUMENTS

| | | | |
|---|---|---|---|
| 4,923,000 A * | 5/1990 | Nelson | F04D 33/00 165/122 |
| 5,008,582 A * | 4/1991 | Tanuma | H01L 23/467 257/E23.099 |
| 5,673,171 A | 9/1997 | Varghese | |
| 5,758,823 A | 6/1998 | Glezer | |
| 5,796,152 A | 8/1998 | Carr | |
| 5,821,962 A | 10/1998 | Kudo | |
| 5,861,703 A * | 1/1999 | Losinski | H01L 23/467 310/330 |
| 6,211,598 B1 | 4/2001 | Dhuler | |
| 6,232,680 B1 | 5/2001 | Bae | |
| 6,450,773 B1 | 9/2002 | Upton | |
| 6,483,419 B1 | 11/2002 | Weaver | |
| 6,498,725 B2 | 12/2002 | Cole | |
| 6,531,947 B1 | 3/2003 | Weaver | |
| 6,570,750 B1 | 5/2003 | Calcatera | |
| 6,598,960 B1 | 7/2003 | Cabal | |
| 6,612,816 B1 | 9/2003 | Vanden Brande | |
| 6,713,942 B2 * | 3/2004 | Raman | F04D 33/00 310/311 |
| 6,771,158 B2 * | 8/2004 | Lee | B81B 3/0051 310/307 |
| 6,853,068 B1 | 2/2005 | Djekic | |
| 6,876,047 B2 | 4/2005 | Cunningham | |
| 7,031,155 B2 * | 4/2006 | Sauciuc | F04D 33/00 257/722 |
| 7,081,699 B2 * | 7/2006 | Keolian | H01L 41/113 310/306 |
| 7,282,837 B2 | 10/2007 | Scher | |
| 7,321,184 B2 * | 1/2008 | Lee | F04D 33/00 310/328 |
| 7,324,323 B2 | 1/2008 | Aksyuk | |
| 7,492,076 B2 * | 2/2009 | Heim | F04B 43/043 310/330 |
| 7,516,776 B2 | 4/2009 | Bezama | |
| 7,553,135 B2 | 6/2009 | Cho | |
| 7,714,433 B2 | 5/2010 | Campini | |
| 7,972,124 B2 | 7/2011 | Hirata | |
| 8,051,905 B2 | 11/2011 | Arik | |
| 8,297,947 B2 * | 10/2012 | Van Rensburg | F04F 7/00 417/413.2 |
| 8,308,453 B2 | 11/2012 | Yamamoto | |
| 8,308,454 B2 | 11/2012 | Kamitani | |
| 8,520,383 B2 * | 8/2013 | Park | H01L 23/467 361/695 |
| 8,520,384 B2 * | 8/2013 | Park | F21V 29/60 361/695 |
| 8,659,896 B2 | 2/2014 | Dede | |
| 8,678,787 B2 | 3/2014 | Hirata | |
| 8,684,707 B2 | 4/2014 | Kanai | |
| 8,736,139 B2 | 5/2014 | Lee | |
| 8,899,944 B2 | 12/2014 | Kanai | |
| 8,934,240 B2 | 1/2015 | Yu | |
| 9,179,575 B1 | 11/2015 | Yao | |
| 9,252,069 B2 | 2/2016 | Bhunia | |
| 9,466,452 B1 | 10/2016 | Liu | |
| 9,846,461 B2 | 12/2017 | Tang | |
| 10,480,502 B2 | 11/2019 | Hirata | |
| 10,788,034 B2 * | 9/2020 | Ganti | F04B 53/08 |
| 10,943,850 B2 * | 3/2021 | Ganti | H01L 23/433 |
| 11,043,444 B2 * | 6/2021 | Ganti | F04D 33/00 |
| 2002/0163782 A1 | 11/2002 | Cole | |
| 2002/0184907 A1 | 12/2002 | Vaiyapuri | |
| 2004/0023614 A1 | 2/2004 | Koplin | |
| 2004/0218362 A1 | 11/2004 | Amaro | |
| 2004/0244405 A1 | 12/2004 | Kim | |
| 2004/0253130 A1 * | 12/2004 | Sauciuc | F04D 33/00 417/436 |
| 2005/0074662 A1 | 4/2005 | Cho | |
| 2005/0089415 A1 | 4/2005 | Cho | |
| 2005/0110841 A1 | 5/2005 | Silverbrook | |
| 2005/0211418 A1 | 9/2005 | Kenny | |
| 2005/0225213 A1 | 10/2005 | Richards | |
| 2005/0266286 A1 | 12/2005 | Sato | |
| 2005/0280994 A1 | 12/2005 | Yazawa | |
| 2006/0164805 A1 | 7/2006 | Meinders | |
| 2006/0208613 A1 | 9/2006 | Scher | |
| 2006/0232167 A1 | 10/2006 | Jordan | |
| 2006/0250773 A1 | 11/2006 | Campbell | |
| 2006/0250774 A1 | 11/2006 | Campbell | |
| 2007/0048154 A1 | 3/2007 | Sapir | |
| 2007/0076375 A1 | 4/2007 | Mongia | |
| 2007/0235180 A1 | 10/2007 | Ouyang | |
| 2007/0274045 A1 | 11/2007 | Campbell | |
| 2008/0041574 A1 | 2/2008 | Arik | |
| 2008/0111866 A1 | 5/2008 | Silverbrook | |
| 2008/0218972 A1 | 9/2008 | Sauciuc | |
| 2008/0304979 A1 | 12/2008 | Lucas | |
| 2009/0021908 A1 | 1/2009 | Patel | |
| 2009/0050294 A1 | 2/2009 | Fedorov | |
| 2009/0120621 A1 | 5/2009 | Sheinman | |
| 2009/0167109 A1 | 7/2009 | Tomita | |
| 2009/0174999 A1 | 7/2009 | Sauciuc | |
| 2009/0232685 A1 | 9/2009 | Kamitani | |
| 2010/0074775 A1 | 3/2010 | Yamamoto | |
| 2011/0063800 A1 | 3/2011 | Park | |
| 2011/0068799 A1 | 3/2011 | Wolf | |
| 2011/0122582 A1 * | 5/2011 | Park | F21V 29/60 361/697 |
| 2011/0211020 A1 | 9/2011 | Silverbrook | |
| 2011/0259557 A1 | 10/2011 | Chao | |
| 2011/0277491 A1 | 11/2011 | Wu | |
| 2011/0304240 A1 | 12/2011 | Meitav | |
| 2012/0063091 A1 | 3/2012 | Dede | |
| 2012/0171062 A1 | 7/2012 | Kodama | |
| 2013/0157729 A1 | 6/2013 | Tabe | |
| 2013/0233523 A1 | 9/2013 | Parida | |
| 2014/0192485 A1 | 7/2014 | Rau | |
| 2015/0007965 A1 | 1/2015 | Joshi | |
| 2015/0009631 A1 | 1/2015 | Joshi | |
| 2015/0043164 A1 | 2/2015 | Joshi | |
| 2015/0308377 A1 | 10/2015 | Packard | |
| 2016/0377072 A1 | 12/2016 | Wu | |
| 2017/0146039 A1 | 5/2017 | Lin | |
| 2017/0276149 A1 | 9/2017 | Dusseau | |
| 2017/0292537 A1 | 10/2017 | Barak | |
| 2017/0363076 A1 | 12/2017 | Najafi | |
| 2018/0061737 A1 | 3/2018 | Arik | |
| 2018/0145010 A1 | 5/2018 | Fukuoka | |
| 2018/0146573 A1 | 5/2018 | Chen | |
| 2018/0146574 A1 | 5/2018 | Chen | |
| 2018/0187672 A1 | 7/2018 | Tanaka | |
| 2019/0101938 A1 | 4/2019 | Mou | |
| 2020/0049386 A1 | 2/2020 | Ganti | |

OTHER PUBLICATIONS

H.Q. Li, "A High Frequency High Flow Rate Piezoelectrically Driven Mems Micropump", Solid-State Sensors, Actuators, and Microsystems Workshop, Jun. 4-8, 2000, pp. 69-72.

* cited by examiner

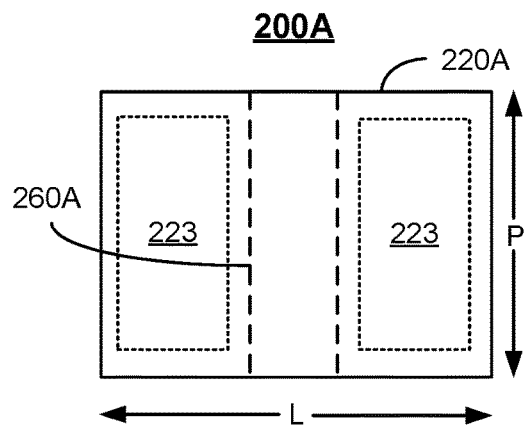
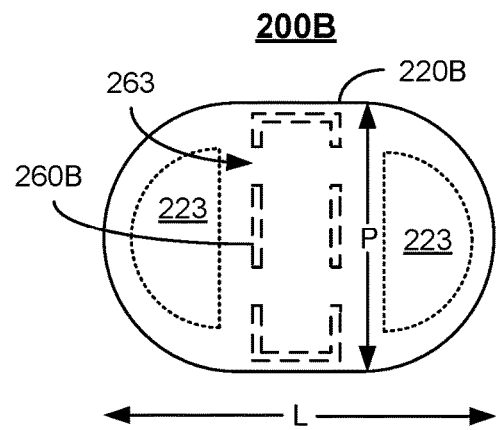
FIG. 2A
FIG. 2B
Anchor can have apertures
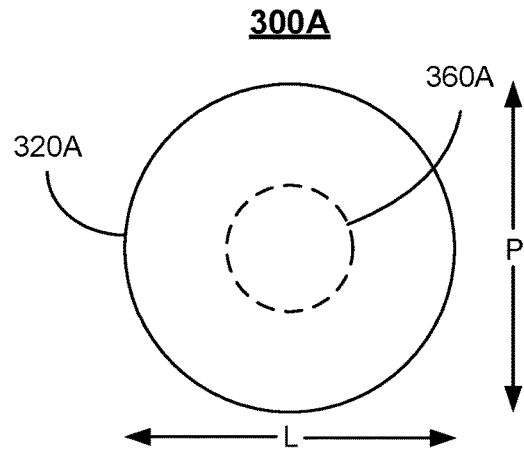
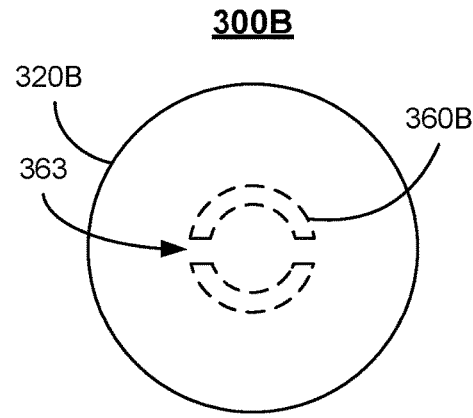
FIG. 3A
FIG. 3B

1400A

1400B

1500

CENTRALLY ANCHORED MEMS-BASED ACTIVE COOLING SYSTEMS

CROSS REFERENCE TO OTHER APPLICATIONS

This application claims priority to U.S. Provisional Patent Application No. 62/945,001 entitled CENTRALLY PINNED COOLING ELEMENTS IN A MEMS-BASED COOLING SYSTEM filed Dec. 6, 2019 which is incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Consequently, additional cooling solutions for computing devices are desired.

BRIEF DESCRIPTION OF THE DRAWINGS

Various embodiments of the invention are disclosed in the following detailed description and the accompanying drawings.

FIGS. 2A-2B depict embodiments of cooling elements usable in active cooling systems including centrally anchored cooling elements.

FIGS. 3A-3B depict embodiments of cooling elements usable in active cooling systems including centrally anchored cooling elements.

DETAILED DESCRIPTION

Figure 1A:
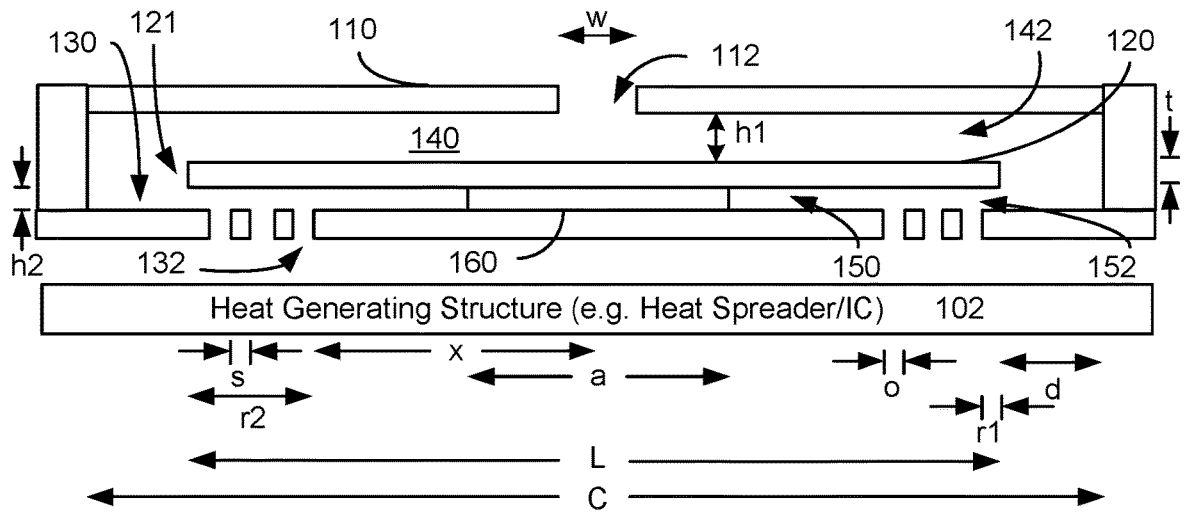
FIGS. 1A-1C depict an embodiment of an active cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan that can be energized in response to an increase in temperature of internal components. The fans drive air through the larger devices to cool internal components. However, such fans are typically too large for mobile devices such as smartphones or for thinner devices such as tablet computers. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated. Thus, additional cooling solutions capable of being used with smaller mobile devices as well as larger devices are desired.

A cooling system is described. The cooling system includes a support structure and a cooling element having a central region and a perimeter. The cooling element is supported at the central region by the support structure. At least a portion of the perimeter of the cooling element is unpinned. The cooling element is configured to undergo vibrational motion when actuated to drive a fluid toward a heat-generating structure. In some embodiments, the cooling element has a first side proximate to the heat-generating structure and a second side distal from the heat-generating structure. The vibrational motion drives the fluid from the second side to the first side of the cooling element. The cooling system may also include a top plate having at least one vent therein. The cooling element is between the top plate and the heat-generating structure. A top chamber is formed between the cooling element and the top plate. In some embodiments, the top chamber has a length from a center of the cooling element to the perimeter corresponding to an odd integer multiplied by a wavelength divided by four. The wavelength is an acoustic wavelength for a frequency of the vibrational motion. The frequency of the vibrational motion also corresponds to a structural resonance for the cooling element and to an acoustic resonance for the top chamber having the wavelength. In some embodiments, the top chamber is a folded top chamber.

In some embodiments, the cooling system includes an orifice plate having at least one orifice therein. The orifice plate is disposed between the cooling element and the heat-generating structure. The cooling element is actuated to drive the fluid through the orifice(s). In some embodiments, the orifice(s) are located at least one hundred micrometers from the perimeter and not more than one millimeter from a portion of the perimeter. In some embodiments, the orifice plate includes a ledge closer to the portion of the perimeter of the cooling element than the orifice(s) are. In some embodiments, the orifice plate includes trench(es) therein. The trench(es) include the orifice(s) therein.

In some embodiments, the vibrational motion of the cooling elements is out-of-phase vibrational motion. In some embodiments, portions of a single cooling element within a cooling cell are actuated out-of-phase. In some embodiments, multiple cooling elements may be operating out-of-phase. For example, multiple cooling elements within a single cooling cell are actuated out-of-phase. In some embodiments, cooling elements in different cells are actuated out-of-phase. For example, cooling elements in adjacent cells may be actuated one hundred and eighty degrees out of phase.

The cooling system may include an elastic structure coupled to the cooling element. For example, the elastic structure can couple multiple cooling elements in a cell and/or can couple multiple portions of a single cooling element. The cooling element may be a piezoelectric cooling element having a length not exceeding eight millimeters. In some embodiments, the cooling element has a length not exceeding ten millimeters. The vibrational motion may drive the fluid toward the heat-generating structure with a speed of at least thirty meters per second. In some embodiments, the vibrational motion drives the fluid such that the fluid is incident on a surface of the heat-generating structure substantially parallel to the normal to the surface and then is deflected to move along the surface of the heat-generating structure to extract heat from the heat-generating structure, the orifice plate being at least not more than two hundred microns from the surface of the heat-generating structure.

A cooling system may include a plurality of cooling cells. Each of the cooling cells may be analogous to those described above. In some embodiments, cooling cells share orifice plate(s) and/or top plate(s). For example, a single top plate may be used for the cooling cells. Such a top plate includes vent(s) for each cooling cell. Similarly, the orifice plate may include a set of orifices for each cooling cell.

A method of cooling a heat-generating structure is described. The method includes driving a cooling element to induce a vibrational motion at a frequency. The cooling element has a central region and a perimeter. The cooling element is supported by a support structure at the central region. At least a portion of the perimeter is unpinned. Thus, the one cooling element is actuated to induce vibrational motion to drive the fluid toward a heat-generating structure. In some embodiments, driving the cooling element includes driving the cooling element at a frequency for the vibrational motion. The frequency corresponds to a structural resonance for the cooling element. Further, the cooling element is between a top plate and the heat-generating structure. The top plate has at least one vent therein. The cooling element and the top plate form a top chamber being between the cooling element and the top plate. The top chamber has a length. The frequency of vibrational motion corresponds to an acoustic resonance having a wavelength corresponding to the length multiplied by four and divided by an odd integer.

Figure 1B:
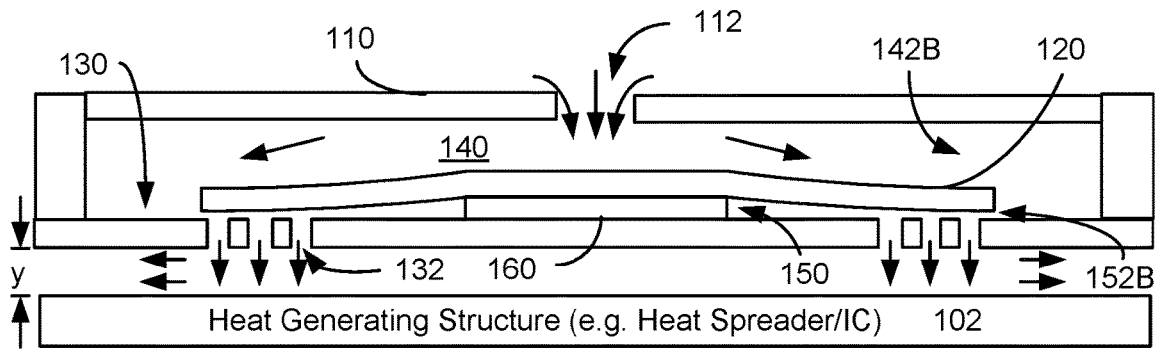
Figure 1C:
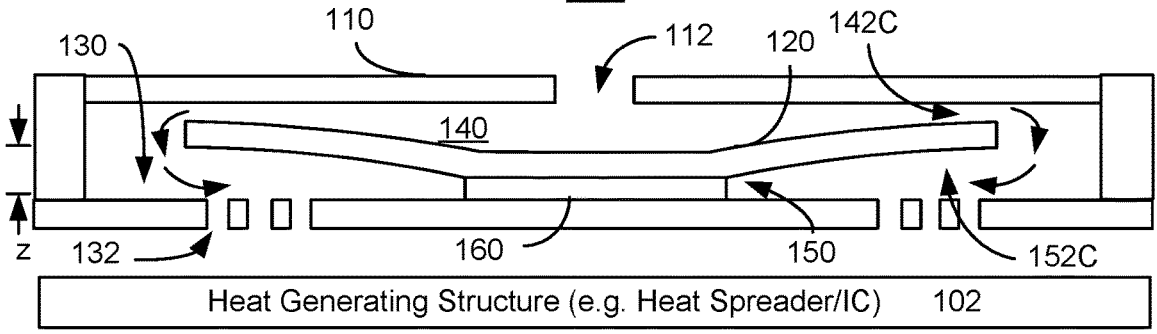

FIGS. 1A-1C are diagrams depicting an exemplary embodiment of active cooling system 100 usable with heat-generating structure 102 and including a centrally anchored cooling element 120. For clarity, only certain components are shown. FIGS. 1A-1C are not to scale. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A.

FIG. 1A depicts cooling system 100 in a neutral position. Thus, cooling element 120 is shown as substantially flat. In operation, cooling element 120 is driven to vibrate between positions shown in FIGS. 1B and 1C. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height of cooling system 100 (from the top of heat-generating structure 102 to the top of top plate 110) may be less than 2 millimeters. In some embodiments, the total height of cooling system 100 is not more than 1.5 millimeters. In some embodiments, the total height does not exceed two hundred and fifty micrometers. In some embodiments, this total height is not more than 1.1 millimeters. In some embodiments, the total height does not exceed one millimeter. Similarly, the distance between the bottom of orifice plate 130 and the top of heat-generating structure 102, y, may be small. In some embodiments, y is at least two hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1C). In such embodiments, portions of cooling element 120 that vibrate (e.g. including tip 121) move in a cantilevered fashion. Thus, portions of cooling element 120 may move in a manner analogous to the wings of a butterfly. The portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1C, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1C. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1C) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/50 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, C/2=n$\lambda$/4, where $\lambda$ is the acoustic wavelength for the fluid and n is odd (e.g. n=1, 3, 5, etc.). For the lowest order mode, C=$\lambda$/2. Because the length of chamber 140 (e.g. C) is close to the length of cooling element 120, in some embodiments, it is also approximately true that L/2=n$\lambda$/4, where $\lambda$ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 13) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments r1 is at least one hundred micrometers (e.g. r1≥100 μm) and r2 is not more than one millimeter (e.g. r2≤1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling element though it is possible that a mechanism other than a piezoelectric might be used to drive the cooling element. In some embodiments, cooling element 120 includes a piezoelectric layer on substrate. The substrate may be a stainless steel, Ni alloy and/or Hastelloy substrate. In some embodiments, piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1C. Although described in the context of particular pressures, gap sizes, and timing of flow, operation of cooling system 100 is not dependent upon the explanation herein. Referring to FIG. 1B, cooling element 120 has been actuated so that its tip 121 moves away from top plate 110. FIG. 1B can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1B. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat generating structure 102 is shown by unlabeled arrows in FIG. 1B.

Cooling element 120 is also actuated so that tip 121 moves away from heat-generating structure 102 and toward top plate 110. FIG. 1C can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1C. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1C. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 10.

The motion between the positions shown in FIGS. 1B and 1C is repeated. Thus, cooling element 120 undergoes vibrational motion indicated in FIGS. 1A-1C, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Using the cooling system 100, fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120 may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120 does not physically contact top plate 110 or orifice plate 130 during vibration. Thus, resonance of cooling element 120 may be more readily maintained. More specifically, physical contact between cooling element 120 and other structures disturbs the resonance conditions for cooling element 120. Disturbing these conditions may drive cooling element 120 out of resonance. Thus, additional power would need to be used to maintain actuation of cooling element 120. Further, the flow of fluid driven by cooling element 120 may decrease. These issues are avoided through the use of pressure differentials and fluid flow as discussed above. The benefits of improved, quiet cooling may be achieved with limited additional power. Consequently, performance of devices incorporating the cooling system 100 may be improved. Further, cooling system 100 may be usable in other applications (e.g. with or without heat-generating structure 102) in which high fluid flows and/or velocities are desired.

FIGS. 2A-2B depict plan views of embodiments of cooling systems 200A and 200B analogous to active cooling systems such as cooling system 100. FIGS. 2A and 2B are not to scale. For simplicity, only portions of cooling elements 220A and 220B and anchors 260A and 260B, respectively, are shown. Cooling elements 220A and 220B are analogous to cooling element 120. Thus, the sizes and/or materials used for cooling elements 220A and/or 220B may be analogous to those for cooling element 120. Anchors (support structures) 260A and 260B are analogous to anchor 160 and are indicated by dashed lines.

For cooling elements 220A and 220B, anchors 260A and 260B are centrally located and extend along a central axis of cooling elements 220A and 220B, respectively. Thus, the cantilevered portions that are actuated to vibrate are to the right and left of anchors 260A and 260B. In some embodiments, cooling element(s) 220A and/or 220B are continuous structures, two portions of which are actuated (e.g. the cantilevered portions outside of anchors 260A and 260B). In some embodiments, cooling element(s) 220A and/or 220B include separate cantilevered portions each of which is attached to the anchors 260A and 260B, respectively, and actuated. Cantilevered portions of cooling elements 220A and 220B may thus be configured to vibrate in a manner analogous to the wings of a butterfly. In FIGS. 2A and 2B, L is the length of the cooling element, analogous to that depicted in FIGS. 1A-1C. Also in FIGS. 2A and 2B, the depth, P, of cooling elements 220A and 220B is indicated.

Also shown by dotted lines in FIGS. 2A-2B are piezoelectric 223. Piezoelectric 223 is used to actuate cooling elements 220A and 220B. Although described in the context of a piezoelectric, another mechanism for actuating cooling elements 220A and 220B can be utilized. Such other mechanisms may be at the locations of piezoelectric 223 or may be located elsewhere. In cooling element 220A, piezoelectric 223 may be affixed to cantilevered portions or may be integrated into cooling element 220A. Further, although piezoelectric 223 is shown as having particular shapes and sizes in FIGS. 2A and 2B, other configurations may be used.

In the embodiment shown in FIG. 2A, anchor 260A extends the entire depth of cooling element 220A. Thus, a portion of the perimeter of cooling element 220A is pinned. The unpinned portions of the perimeter of cooling element 220A are part of the cantilevered sections that undergo vibrational motion. In other embodiments, anchor need not extend the entire length of the central axis. In such embodiments, the entire perimeter of the cooling element is unpinned. However, such a cooling element still has cantilevered sections configured to vibrate in a manner described herein. For example, in FIG. 2B, anchor 260B does not extend to the perimeter of cooling element 220B. Thus, the perimeter of cooling element 220B is unpinned. However, anchor 260B still extends along the central axis of cooling element 220B. Cooling element 220B is still actuated such that cantilevered portions vibrate (e.g. analogous to the wings of a butterfly).

Although cooling element 220 A is depicted as rectangular, cooling elements may have another shape. In some embodiments, corners of cooling element 220A may be rounded. Cooling element 220B of FIG. 2B has rounded cantilevered sections. Other shapes are possible. In the embodiment shown in FIG. 2B, anchor 260B is hollow and includes apertures 263. In some embodiments, cooling element 220B has aperture(s) in the region of anchor 260B. In some embodiments, cooling element 220B includes multiple portions such that aperture(s) exist in the region of anchor 260B. As a result, fluid may be drawn through cooling element 220B and through anchor 260B. Thus, cooling element 220B may be used in place of a top plate, such as top plate 110. In such embodiments, apertures in cooling element 220B and apertures 263 may function in an analogous manner to vent 112.

FIGS. 3A-3B depict plan views of embodiments of cooling systems 300A and 300B analogous to active cooling systems such as cooling system 100. FIGS. 3A and 3B are not to scale. For simplicity, only cooling elements 320A and 320B and anchors 360A and 360B, respectively, are shown. Cooling elements 320A and 320B are analogous to cooling element 120. Thus, the sizes and/or materials used for cooling elements 320A and/or 320B may be analogous to those for cooling element 120. Anchors 360A and 360B are analogous to anchor 160 and are indicated by dashed lines.

For cooling elements 320A and 320B, anchors 360A and 360B, respectively, are limited to a central region of cooling elements 320A and 320B, respectively. Thus, the regions surrounding anchors 360A and 360B undergo vibrational motion. Cooling elements 320A and 320B may thus be configured to vibrate in a manner analogous to a jellyfish or similar to the opening/closing of an umbrella. In some embodiments, the entire perimeter of cooling elements 320A and 320B vibrate in phase (e.g. all move up or down together). In other embodiments, portions of the perimeter of cooling elements 320A and 320B vibrate out of phase. In FIGS. 3A and 3B, L is the length (e.g. diameter) of the cooling element, analogous to that depicted in FIGS. 1A-1C.

Although cooling elements 320A and 320B are depicted as circular, cooling elements may have another shape. Further, a piezoelectric (not shown in FIGS. 3A-3B) and/or other mechanism may be used to drive the vibrational motion of cooling elements 320A and 320B.

In the embodiment shown in FIG. 3B, the anchor 360B is hollow and has apertures 363. In some embodiments, cooling element 320B has aperture(s) in the region of anchor 360B. In some embodiments, cooling element 320B includes multiple portions such that aperture(s) exist in the region of anchor 360B. As a result, fluid may be drawn through cooling element 320B and through anchor 360B.The fluid may exit through apertures 363. Thus, cooling element 320B may be used in place of a top plate, such as top plate 110. In such embodiments, apertures in cooling element 320B and apertures 363 may function in an analogous manner to vent 112.

Cooling systems such as cooling system 100 can utilize cooling element(s) 220A, 220B, 320A, 320B and/or analogous cooling elements. Such cooling systems may also share the benefits of cooling system 100. Cooling systems using cooling element(s) 220A, 220B, 320A, 320B and/or analogous cooling elements may more efficiently drive fluid toward heat-generating structures at high speeds. Consequently, heat transfer between the heat-generating structure and the moving fluid is improved. Because the heat-generating structure is more efficiently cooled, the corresponding device may exhibit improved operation, such as running at higher speed and/or power for longer times. Cooling systems employing cooling element(s) 220A, 220B, 320A, 320B and/or analogous cooling elements may be suitable for use in smaller and/or mobile devices in which limited space is available. Performance of such devices may thus be improved. Because cooling element(s) 220A, 220B, 320A, 320B and/or analogous cooling elements may be vibrated at frequencies of 15 kHz or more, users may not hear any noise associated with actuation of cooling elements. If driven at or near the acoustic and/or structural resonance frequencies for the cooling element(s) 220A, 220B, 320A, 320B and/or analogous cooling elements, the power used in operating cooling systems may be significantly reduced. Cooling element(s) 220A, 220B, 320A, 320B and/or analogous cooling elements may not physically contact the plates during use, allowing resonance to be more readily maintained. The benefits of improved, quiet cooling may be achieved with limited additional power. Consequently, performance of devices incorporating the cooling element(s) 220A, 220B, 320A, 320B and/or analogous cooling elements may be improved.

FIGS. 4A-4E depict embodiments of active cooling systems 400A, 400B, 400C, 400D and 400E including centrally anchored cooling elements. FIGS. 4A-4E are not to scale and only the neutral configurations are shown. For simplicity, only portions of cooling systems 400A, 400B, 400C, 400D and 400E are shown. In particular, cooling systems 400A, 400B, 400C, 400D and 400E are analogous to cooling system 100. Consequently, analogous components have similar labels. For example, cooling systems 400A, 400B, 400C, 400D and 400E are used in conjunction with heat-generating structure 402, which is analogous to heat-generating structure 102.

Cooling system 400A includes top plate 410 having vent 412, cooling element 420A, orifice plate 430A including orifices 432A, top chamber 440 having gap 442, bottom chamber 450 having gap 452 and anchor (i.e. support structure) 460 that are analogous to top plate 110 having vent 112, cooling element 120, orifice plate 130 including orifices 132, top chamber 140 having gap 142, bottom chamber 150 having gap 152 and anchor (i.e. support structure) 160, respectively. Thus, cooling element 420A is centrally supported by anchor 460 such that at least a portion of the perimeter of cooling element 420A is free to vibrate. In some embodiments, anchor 460 extends along the axis of cooling element 420A (e.g. in a manner analogous to anchor 260A and/or 260B). In other embodiments, anchor 460 is only near the center portion of cooling element 420A (e.g. analogous to anchor 360A and/or 360B).

Orifice plate 430A also includes trench 434A around orifices 432A. In some embodiments, trench 434A is at least twenty five micrometers and not more than one hundred and fifty micrometers deep. Trench 434A is configured such that orifices 432A reside at the bottom of trench 434A. The sidewalls of trench 434A are shown as perpendicular to the top surface of orifice plate 430A. In some embodiments, the sidewalls of trench 434A are at a different angle to top surface of orifice plate 430A. In some embodiments, trench 434A extends across the orifice plate 430A (e.g. parallel to the top surface of orifice plate 430A) such that up to fifty percent of the surface of orifice plate 430A aligned with cooling element 420A is part of trench 434A. In addition, orifices 432A are conical in cross-section. Thus, the sidewalls of orifices 432A are not perpendicular to the surface of orifice plate 430. Instead, the sidewalls of orifices 432A are angled such that the portion of orifices 432A closer to cooling element 420A are wider than the portions of orifices 432A closer to heat-generating structure 402.

Cooling system 400A operates in a manner analogous to cooling system 100 and shares the benefit(s) of cooling system 100. In addition, the use of trench 434A allows gap 452 to be better controlled. In some embodiments, gap 452 is desired not to exceed five micrometers for the closest pass to orifice plate 430A (e.g. at the bottom of the down stroke of cooling element 420A). Consequently, the backflow of fluid through orifices 432A into bottom chamber 450 may be further reduced. Use of angled orifices 432A may improve the formation of droplets of fluid exiting orifices 432A. Thus, performance of cooling system 400A may be further improved.

Figure 4A:
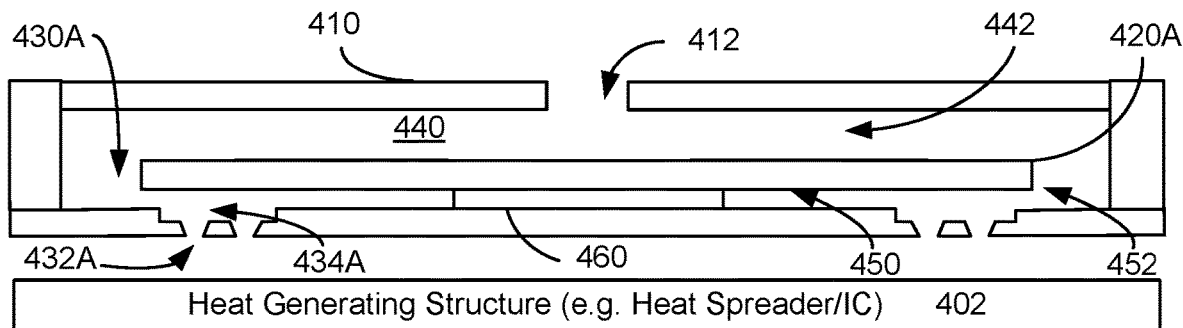
FIGS. 4A-4E depict embodiments of active cooling systems including centrally anchored cooling elements.
Figure 4B:
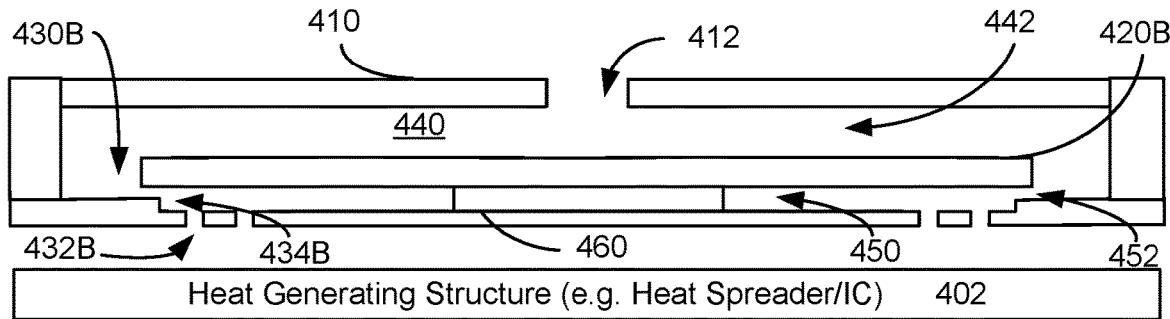

Cooling system 400B of FIG. 4B includes top plate 410 having vent 412, cooling element 420A, orifice plate 430B including orifices 432B, top chamber 440 having gap 442, bottom chamber 450 having gap 452 and anchor (i.e. support structure) 460 that are analogous to top plate 110 having vent 112, cooling element 120, orifice plate 130 including orifices 132, top chamber 140 having gap 142, bottom chamber 150 having gap 152 and anchor (i.e. support structure) 160, respectively. Thus, cooling element 420B is centrally supported by anchor 460 such that at least a portion of the perimeter of cooling element 420B is free to vibrate. In some embodiments, anchor 460 extends along the axis of cooling element 420B (e.g. in a manner analogous to anchor 260A and/or 260B). In other embodiments, anchor 460 is only near the center portion of cooling element 420B (e.g. analogous to anchor 360A and/or 360B).

Orifice plate 430B also includes ledge 434B near orifices 432B. In some embodiments, ledge 434B is at least twenty five micrometers and not more than one hundred and fifty micrometers high. In some embodiments, ledge 434B is formed by adding material to orifice plate 430B. In other embodiments, ledge 434B may be formed by extending a trench analogous to trench 434A across the bottom of orifice plate 430B. Ledge 434B is shown as perpendicular to the top surface of orifice plate 430B. In some embodiments, ledge 434B is at a different angle to top surface of orifice plate 430B. Ledge 434B is configured such that orifices 432B reside lower than the top surface of ledge 434B. In the embodiment shown, orifices 432B are cylindrical in cross-section. Stated differently, the sidewalls of orifices 432B are perpendicular to the surface of orifice plate 430B. However, other shapes are possible.

Cooling system 400B operates in a manner analogous to cooling system 100 and shares the benefit(s) of cooling system 100. In addition, the use of ledge 434B allows gap 452 to be better controlled. Consequently, the backflow of fluid through orifices 432B into bottom chamber 450 may be reduced. In some embodiments, gap 452 is desired not to exceed five micrometers for the closest pass to orifice plate 430B (e.g. at the bottom of the down stroke of cooling element 420B). Thus, performance of cooling system 400B may be further improved.

Figure 4C:
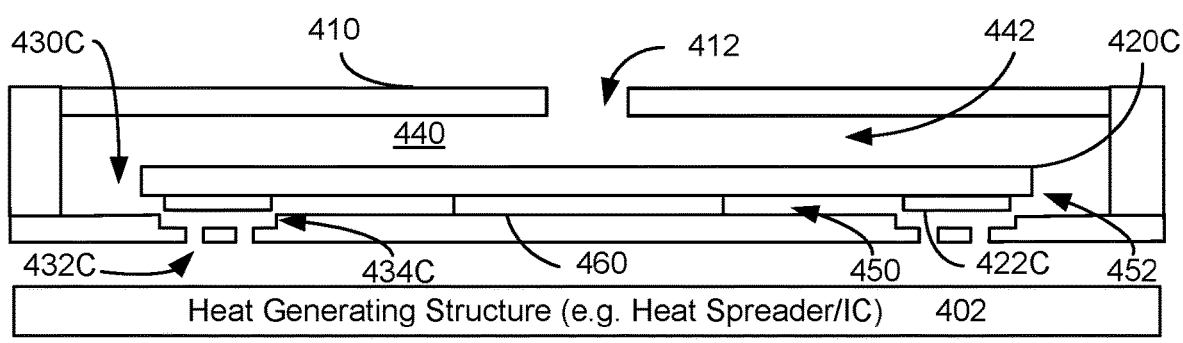

Cooling system 400C of FIG. 4C includes top plate 410 having vent 412, cooling element 420C, orifice plate 430C including orifices 432C, top chamber 440 having gap 442, bottom chamber 450 having gap 452 and anchor (i.e. support structure) 460 that are analogous to top plate 110 having vent 112, cooling element 120, orifice plate 130 including orifices 132, top chamber 140 having gap 142, bottom chamber 150 having gap 152 and anchor (i.e. support structure) 160, respectively. Thus, cooling element 420C is centrally supported by anchor 460 such that at least a portion of the perimeter of cooling element 420C is free to vibrate. In some embodiments, anchor 460 extends along the axis of cooling element 420C (e.g. in a manner analogous to anchor 260A and/or 260B). In other embodiments, anchor 460 is only near the center portion of cooling element 420C (e.g. analogous to anchor 360A and/or 360B).

Orifice plate 430C is also analogous to orifice plate 430A in that orifice plate 430C includes trench 434C. In the embodiment shown, orifices 432C are analogous to orifices 432B and, therefore, cylindrical in cross-section. Stated differently, the sidewalls of orifices 432C are perpendicular to the surface of orifice plate 430C. However, other shapes are possible.

Cooling element 420C includes a top ledge 422C. Orifice plate 430C includes trench 434C configured such that top ledge 422C is within trench 434C when actuated. For example, top ledge 422C may be at least ten micrometers and not more than seventy five micrometers high. Similarly, trench 434C may have a depth of at least twenty-five and not more than one hundred and fifty micrometers. In some embodiments, orifice plate 430C may include a ledge instead of trench 434C. In such an embodiment, top ledge 422C may extend to anchor 460.

Cooling system 400C operates in a manner analogous to cooling system 100 and shares the benefit(s) of cooling system 100. In addition, the use of top ledge 422C in connection with trench 434C allows gap 452, and thus backflow, to be better controlled. Thus, performance of cooling system 400C may be further improved.

Figure 4D:
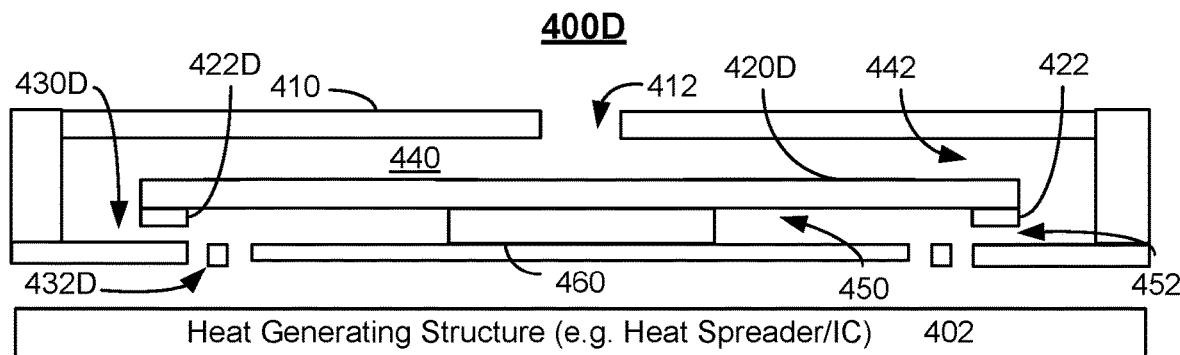

Cooling system 400D of FIG. 4D includes top plate 410 having vent 412, cooling element 420D, orifice plate 430D including orifices 432D, top chamber 440 having gap 442, bottom chamber 450 having gap 452 and anchor (i.e. support structure) 460 that are analogous to top plate 110 having vent 112, cooling element 120, orifice plate 130 including orifices 132, top chamber 140 having gap 142, bottom chamber 150 having gap 152 and anchor (i.e. support structure) 160, respectively. Thus, cooling element 420D is centrally supported by anchor 460 such that at least a portion of the perimeter of cooling element 420D is free to vibrate. In some embodiments, anchor 460 extends along the axis of cooling element 420D (e.g. in a manner analogous to anchor 260A and/or 260B). In other embodiments, anchor 460 is only near the center portion of cooling element 420D (e.g. analogous to anchor 360A and/or 360B). Cooling element 420D includes top ledge 422D. In some embodiments, top ledge 422C is at least ten micrometers and not more than seventy five micrometers high.

Cooling system 400D operates in a manner analogous to cooling system 100 and shares the benefit(s) of cooling system 100. In addition, the use of top ledge 422D allows gap 452, and thus backflow, to be better controlled. Thus, performance of cooling system 400D may be further improved.

Figure 4E:
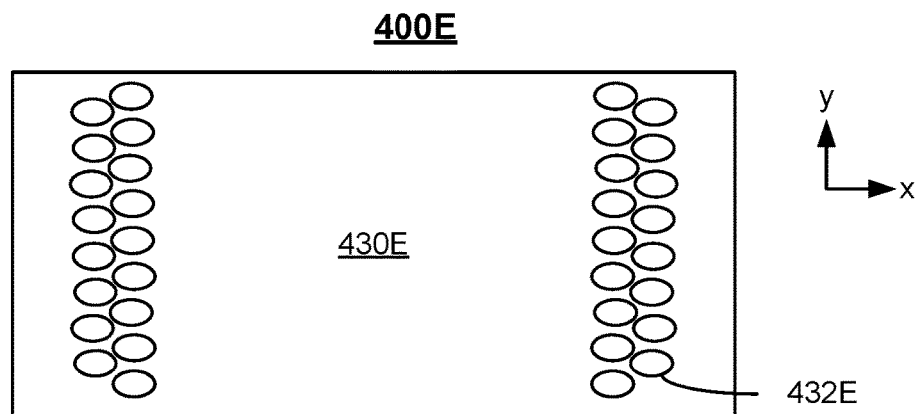

FIG. 4E depicts a plan view orifice plate 430E of cooling system 400E. Cooling system 400E is analogous to cooling system 100. Thus, orifice plate 430E including orifices 432E is analogous to orifice plate 130 including orifices 132. The remaining portions of cooling system 400E are analogous to the corresponding structures in cooling system(s) 100, 400A, 400B, 400C and/or 400D. For example, although not shown in FIG. 4E, orifice plate 430E may include a trench or ledge analogous to trench(es) 434A and/or 434C or ledge 434B.

Orifice plate 430E includes orifices 432E having an elliptical footprint. For example, the minor (short) axis of orifices 432E is at least one hundred and not more than three hundred micrometers in some embodiments. In some embodiments, the major (long) axis of orifices 432E is at least two hundred and not more than four hundred micrometers. Other lengths are possible. Further, not all orifices 432E have the same shape and/or size in some embodiments. Although not indicated in FIG. 4E, orifices 432E may be conical (e.g. analogous to orifices 432A) or have another shape. Because orifices 432E are not circular, orifices 432E may be packed differently in a given area. For example, orifices 432E are offset in the x-direction and the edges of columns of orifices 432E overlap. Thus, a higher density of orifices 432E may be included in orifice plate 430A than if orifices 432E were circular. Thus, the shape, location and distribution of orifices can be tailored.

Cooling system 400E operates in a manner analogous to cooling system 100 and shares the benefit(s) of cooling system 100. Moreover, the shape, location and distribution of orifices can be engineered. The desired flow through orifices 432E may be achieved. Thus, performance of cooling system 400E may be further improved. Further, cooling systems 400A, 400B, 400C, 400D and/or 400E may be usable in other applications (e.g. with or without heat-generating structure 402) in which high fluid flows and/or velocities are desired.

Figure 5:
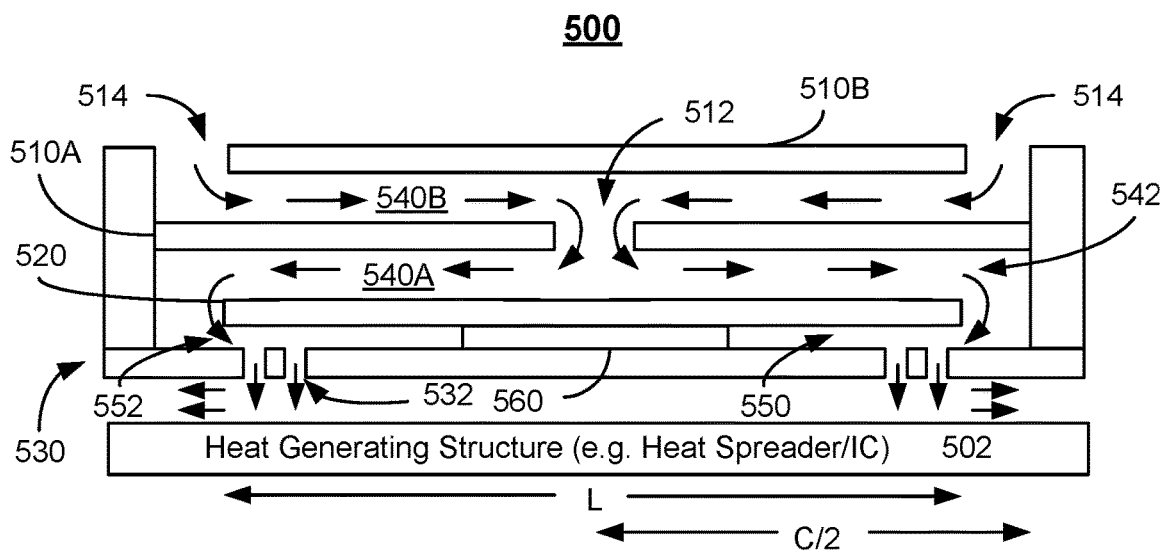
FIG. 5 depicts an embodiment of an active cooling system including a centrally anchored cooling element and a folded top chamber.

FIG. 5 depicts an embodiment of active cooling system 500 including a centrally anchored cooling element and a folded top chamber. FIG. 5 is not to scale and only the neutral configuration is shown. For simplicity, only portions of cooling system 500 are shown. Cooling system 500 is analogous to cooling system 100. Cooling system 500 includes top plates 510A and 510B (collectively top plates 510) having vents 512 and 514, cooling element 520, orifice plate 530 including orifices 532, top chambers 540A and 540B (collectively top chamber 540) having gap 542, bottom chamber 550 having gap 552 and anchor (i.e. support structure) 560 that are analogous to top plate 110 having vent 112, cooling element 120, orifice plate 130 including orifices 132, top chamber 140 having gap 142, bottom chamber 150 having gap 152 and anchor (i.e. support structure) 160, respectively. Thus, cooling element 520 is centrally supported by anchor 560 such that at least a portion of the perimeter of cooling element 520 is free to vibrate. In some embodiments, anchor 560 extends along the axis of cooling element 520 (e.g. in a manner analogous to anchor 260A and/or 260B). In other embodiments, anchor 560 is only near the center portion of cooling element 520 (e.g. analogous to anchor 360A and/or 360B). Further, orifice plate 530, orifices 532 and/or cooling element 520 may be configured in an analogous manner to one or more of orifice plate(s) 430A, 430B, 430C, 430D and/or 430E; orifices 432A, 432B, 432C, 432D and/or 432E; and/or cooling element(s) 420A, 420B, 420C and/or 420D.

Top chamber 540 is analogous to top chamber 140 but is a folded chamber including two portions: top chamber 540A and top chamber 540B. Top chamber 540 and cooling element 520 may still be configured such that the acoustic resonant frequency of top chamber 540 is at or near the structural resonant frequency of cooling element 520. However, the length of top chamber 540 includes the portions of top chamber 540A and of top chamber 540B. In particular, fluid enters top chamber 540 through vents 514, traverses part of top chamber 540B to vent 512, passes through vent 512, traverses part of top chamber 540A to the periphery of cooling element 520, is transferred to bottom chamber 550 and is driven out of orifices 532. This path is depicted by unlabeled arrows in FIG. 5. Thus, fluid travels a distance of approximately C (the entire width of chambers 540/550) between entering top chamber 540 at vent 514 and being transferred to bottom chamber 550 near the periphery of cooling element 520. This is twice the distance traveled for top chamber 140 of cooling system 100 depicted in FIG. 1.

Cooling element 520 is desired to be driven at a frequency corresponding to its structural resonance (e.g. at or near the structural resonant frequency). This frequency is also desired to correspond to (e.g. be at or near) an acoustic resonant frequency of cooling system 500/top chamber 540. Further, at acoustic resonance, a node in pressure occurs at vent 514 and an antinode in pressure is developed at the periphery of cooling element 520. Thus, C =effective length of top chamber $540=n\lambda/4$, where $\lambda$ is the acoustic wavelength for the fluid and n is odd (e.g. n=1, 3, 5, etc.). Thus, cooling element 520 and cooling system 500 may be made half as long for approximately the same acoustic resonant frequency. The frequency at which cooling element 520 is driven, v, is not only the structural resonant frequency for cooling element 520, but also at or near the acoustic resonant frequency for at least top chamber 540. In some embodiments, cooling element 520 is driven at a frequency corresponding to the lowest order acoustic mode ($C=\lambda/4$). In some embodiments, cooling element 520 is driven at a frequency corresponding to the next order acoustic mode ($C=3\lambda/4$).

Cooling system 500 operates in a manner analogous to cooling system 100 and shares the benefit(s) of cooling system 100. Further, cooling system 500 utilizes folded top chamber 540. As a result, cooling system 500, chambers 540/550 and cooling element 520 may be made narrower than cooling system 100 for approximately the same driving (and resonant) frequency. Thus, cooling system 500 may also have a smaller footprint than cooling system 100. Cooling system 500 may also be usable in other applications (e.g. with or without heat-generating structure 502) in which high fluid flows and/or velocities are desired.

Figure 6A:
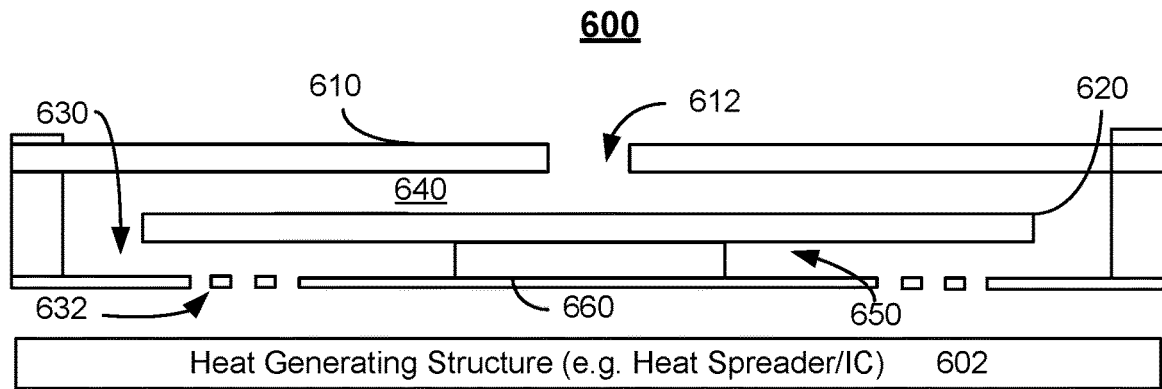
FIGS. 6A-6C depict an embodiment of an active cooling system including multiple cooling elements.
Figure 6B:
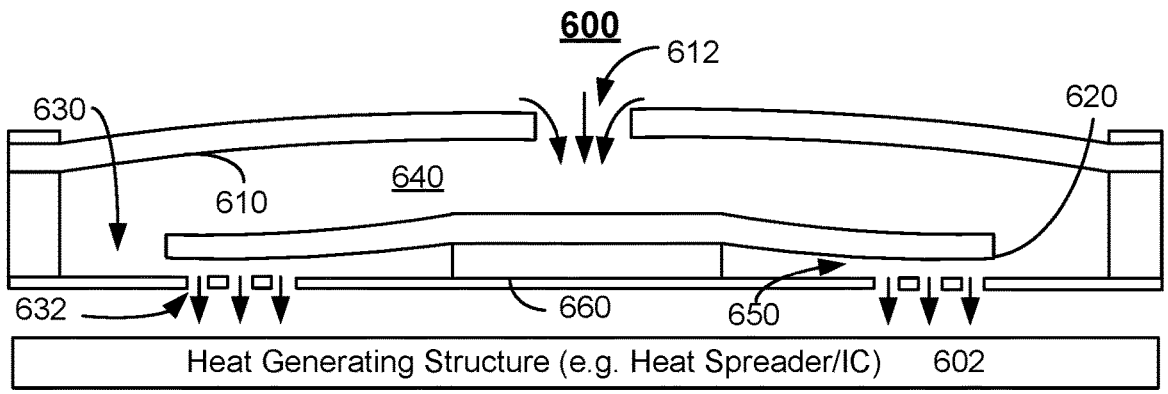
Figure 6C:
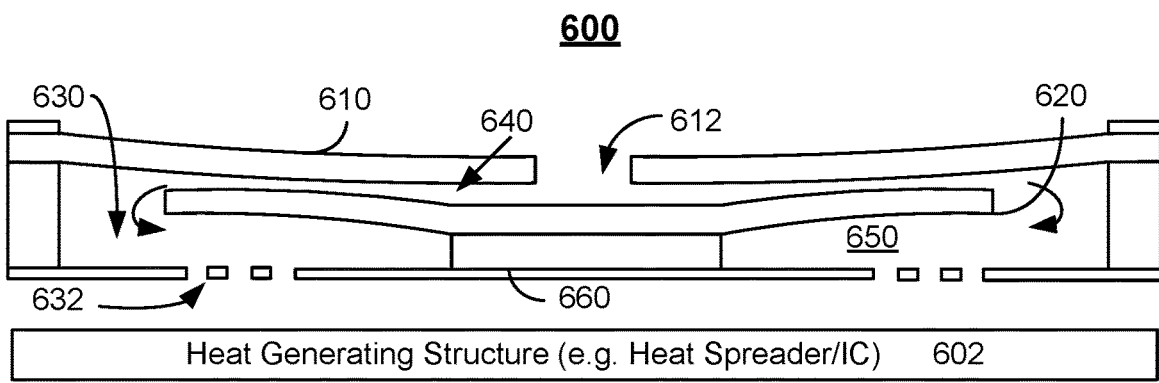

FIGS. 6A-6C depict an embodiment of active cooling system 600 including multiple cooling elements 620 and 610. FIGS. 6A-6C are not to scale. FIG. 6A depicts a neutral configuration. FIG. 6B depicts the end of the down stroke of cooling element 620 and of the upstroke of cooling element 610. FIG. 6C depicts the end of the upstroke of cooling element 620 and of the down stroke of cooling element 610. For simplicity, only portions of cooling system 600 are shown. Cooling system 600 is analogous to cooling system 100. Cooling system 600 includes cooling element 620, orifice plate 630 including orifices 632, top chamber 640, bottom chamber 650 and anchor (i.e. support structure) 660 that are analogous to cooling element 120, orifice plate 130 including orifices 132, top chamber 140, bottom chamber 150 and anchor (i.e. support structure) 160, respectively. Thus, cooling element 620 is centrally supported by anchor 660 such that at least a portion of the perimeter of cooling element 620 is free to vibrate. In some embodiments, anchor 660 extends along the axis of cooling element 620 (e.g. in a manner analogous to anchor 260A and/or 260B). In other embodiments, anchor 660 is only near the center portion of cooling element 620 (e.g. analogous to anchor 360A and/or 360B). Further, orifice plate 630, orifices 632 and/or cooling element 620 may be configured in an analogous manner to one or more of the other orifice plate(s) and/or cooling element(s) depicted herein.

In cooling system 600, the top plate is replaced by cooling element 610. Cooling element 610 thus has vent 612 and is supported, or anchored, at its periphery. Thus, the maximum deflection of cooling element 610 may occur near the center (e.g. near vent 612). Although a single, centrally located vent 612 is shown, multiple vents and/or vent(s) located elsewhere (including on sidewalls) may be used. Cooling elements 610 and 620 are also driven out-of-phase. In some embodiments, vibrational motion of cooling elements 610 and 620 are at or near one hundred and eighty degrees out of phase. Thus, as cooling element 620 undergoes a down stroke, cooling element 610 undergoes an upstroke, and vice versa. This is depicted in FIGS. 6B and 6C.

Cooling elements 610 and 620 are also desired to be driven at their structural resonant frequencies. Thus, the structural resonant frequencies of cooling elements 610 and 620 are selected to be close. In some embodiments, the resonant frequencies of cooling elements 610 and 620 are desired to be within one hundred Hertz of each other. In some embodiments, feedback is used to maintain cooling elements 610 and 620 at or near resonance. For example, the current used to drive cooling elements 610 and 620 may be periodically measured and the driving frequencies of cooling elements 610 and 620 adjusted to maintain resonance. In some embodiments, cooling element(s) 610 and/or 620 are driven within a few hundred Hertz of the resonant frequency/frequencies for optimized performance. However, other frequencies are possible. The driving frequencies for cooling elements 610 and 620 may also be adjusted to maintain cooling elements at or near one hundred and eighty degrees out-of-phase. Further, the structural resonant frequencies of cooling elements 610 and 620, as well as their driving frequencies, are desired to be at or near the acoustic resonant frequency of top chamber 640 of cooling system 600.

In operation, cooling element 610 undergoes an upstroke while cooling element 620 undergoes a down stroke, as indicated in FIG. 6B. Thus, cooling element 620 drives fluid out of orifices 632 at high speeds such as those discussed with respect to cooling system 100. Further, fluid is drawn into top chamber 640 via vent 612. This fluid motion is shown by unlabeled arrows in FIG. 6B. As cooling element 620 undergoes an upstroke and cooling element 620 undergoes a down stroke, fluid is driven from top chamber 640 into bottom chamber 650. This fluid motion is shown by unlabeled arrows in FIG. 6C. Orifice plate 630, orifices 632 and/or cooling element 620 are also configured to reduce or eliminate suction that would result in a backflow of fluid through orifices 632 into bottom chamber 650. Thus, cooling system 600 operates in a similar manner to cooling system 100. Consequently, the benefits of cooling system 100 may be achieved. Further, cooling system 600 may be usable in other applications (e.g. with or without heat-generating structure 602) in which high fluid flows and/or velocities are desired.

Figure 7A:
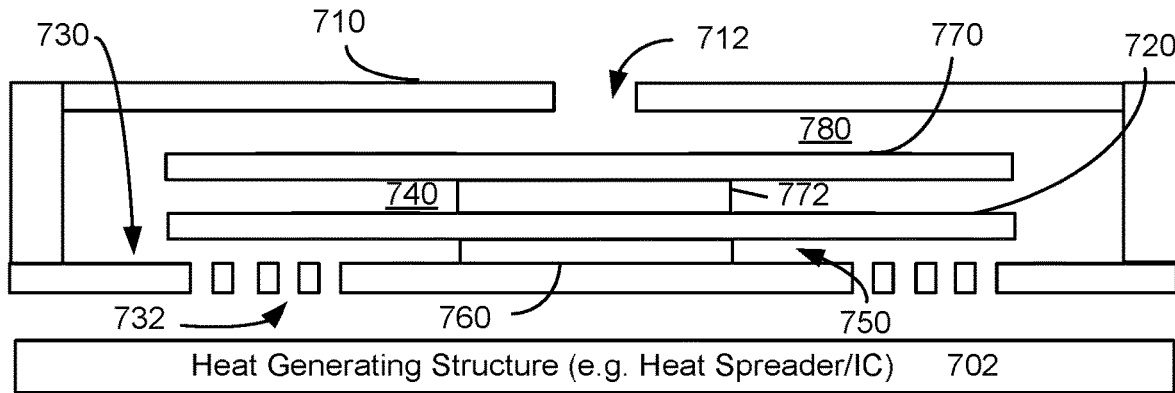
FIG. 7A-7C depict an embodiment of an active cooling system including multiple centrally anchored cooling elements.
Figure 7B:
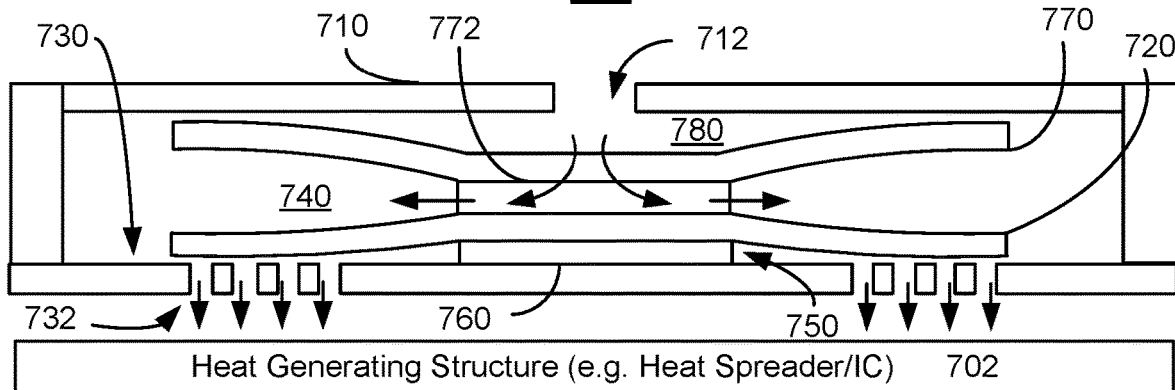
Figure 7C:
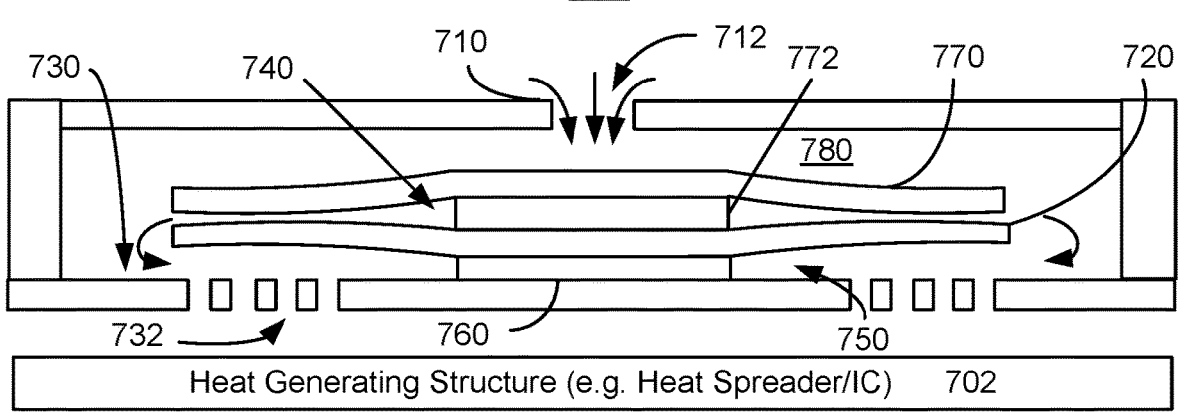

FIGS. 7A-7C depict an embodiment of active cooling system 700 including multiple centrally anchored cooling elements 720 and 770. FIGS. 7A-7C are not to scale. FIG. 7A depicts a neutral configuration. FIG. 7B depicts the end of the down stroke of cooling element 720 and of the upstroke of cooling element 770. FIG. 7C depicts the end of the upstroke of cooling element 720 and of the down stroke of cooling element 770. For simplicity, only portions of cooling system 700 are shown. Cooling system 700 is analogous to cooling system 100. Cooling system 700 includes top plate 710 having vent 712, cooling element 720, orifice plate 730 including orifices 732, top chamber 740, bottom chamber 750 and anchor (i.e. support structure) 760 that are analogous to top plate 110 having vent 112, cooling element 120, orifice plate 130 including orifices 132, top chamber 140, bottom chamber 150 and anchor (i.e. support structure) 160, respectively. Thus, cooling element 720 is centrally supported by anchor 760 such that at least a portion of the perimeter of cooling element 720 is free to vibrate. In some embodiments, anchor 760 extends along the axis of cooling element 720 (e.g. in a manner analogous to anchor 260A and/or 260B). In other embodiments, anchor 760 does not extend along the axis of cooling element 720 (e.g. in a manner analogous to anchor 360A and/or 360B). Further, orifice plate 730, orifices 732 and/or cooling element 720 may be configured in an analogous manner to one or more of the other orifice plate(s) and/or cooling element(s) depicted herein.

Cooling system 700 also includes cooling element 770, support structure (e.g. anchor) 772 and upper chamber 780. Cooling element 770 is centrally supported by anchor 772 such that at least a portion of the perimeter of cooling element 770 is free to vibrate. In some embodiments, anchor 772 extends along the axis of cooling element 770 (e.g. in a manner analogous to anchor 260A and/or 260B). In some embodiments, anchor 772 does not extend along the axis of cooling element 770 (e.g. in a manner analogous to anchor 360A and/or 360B).

In some embodiments, cooling elements 720 and 770 are driven out-of-phase. In some embodiments, vibrational motion of cooling elements 720 and 770 are at or near one hundred and eighty degrees out of phase. Thus, as cooling element 720 undergoes a down stroke, cooling element 770 undergoes an upstroke, and vice versa. Cooling elements 720 and 770 are also desired to be driven at their structural resonant frequencies. Thus, the structural resonant frequencies of cooling elements 720 and 770 are selected to be close. In some embodiments, the resonant frequencies of cooling elements 720 and 770 are desired to be within one hundred Hertz of each other. In some embodiments, feedback is used to maintain cooling element(s) at or near resonance. For example, the current used to drive cooling elements 720 and 770 may be periodically measured and the driving frequency of cooling elements 720 and 770 adjusted to maintain resonance. In some embodiments, cooling element(s) 720 and/or 770 are driven within a few hundred Hertz of the resonant frequency/frequencies for optimized performance. However, other frequencies are possible. The driving frequencies for cooling elements 720 and 770 may also be adjusted to maintain cooling elements at or near one hundred and eighty degrees out-of-phase. Further, the structural resonant frequencies of cooling elements 720 and 770, as well as their driving frequencies, are desired to be at or near the acoustic resonant frequency of cooling system 700.

In operation, cooling element 770 undergoes an upstroke while cooling element 720 undergoes a down stroke, as indicated in FIG. 7B. Thus, cooling element 720 drives fluid out of orifices 732 at high speeds, such as those described with respect to cooling system 100. Also in the upstroke of cooling element 770, fluid is driven from upper chamber 780 into top chamber 740. In the embodiment shown, apertures (not shown) in anchor 772 and cooling element 770 allow fluid to flow from upper chamber 780 through anchor 772 into chamber 740. This fluid motion is indicated by unlabeled arrows in FIG. 7B. In other embodiments, in which apertures in anchor 772 and cooling element 770 are not present, fluid flows from upper chamber 780 to top chamber 740 at the periphery of cooling system 700. As cooling element 720 undergoes an upstroke and cooling element 770 undergoes a down stroke, fluid is driven from top chamber 740 into bottom chamber 750. Fluid is also drawn into upper chamber 780 through vent 712. The fluid motion is indicated by unlabeled arrows in FIG. 7C. Orifice plate 730, orifices 732 and/or cooling element 720 are also configured to reduce or eliminate suction that would result in a backflow of fluid through orifices 732 into bottom chamber 750.

Thus, cooling system 700 operates in a similar manner to cooling system 100. Consequently, the benefits of cooling system 100 may be achieved. Further, use of multiple cooling elements 720 and 770 may allow cooling system 700 to be operated even at higher back pressures in the jet channel (the region between heat generating structure 702 and orifice plate 730). Thus, the range of applications in which cooling system 700 may be utilized can be increased. Further, cooling system 700 may be usable in other applications (e.g. with or without heat-generating structure 702) in which high fluid flows and/or velocities are desired.

Figure 8A:
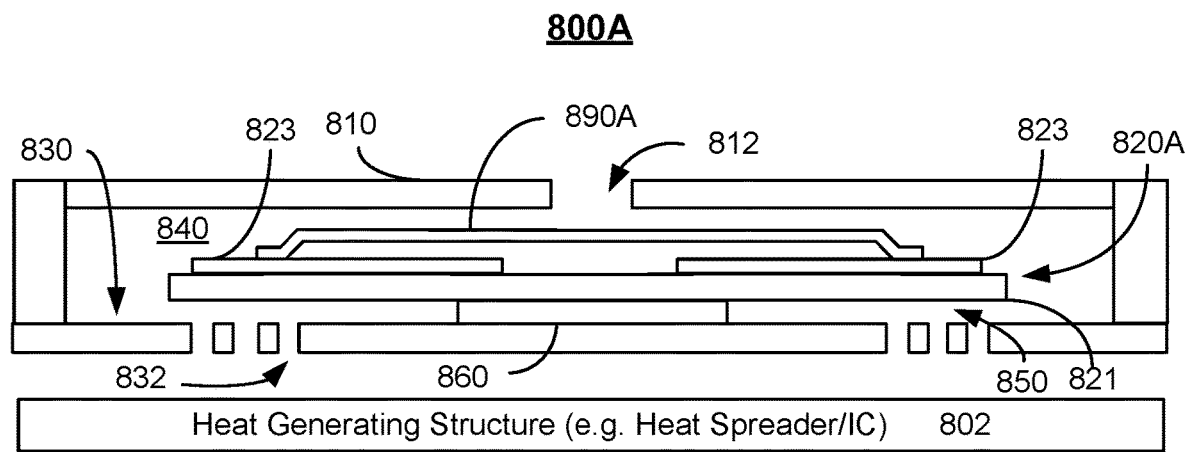
FIGS. 8A-8E depicts embodiments of active cooling systems including centrally anchored cooling elements and elastic structures.

FIGS. 8A-8E depicts embodiments of active cooling systems 800A, 800B, 800C, including centrally anchored cooling elements and elastic structures 890D and 890E. FIGS. 8A-8E are not to scale. FIG. 8A depicts cooling system 800A utilizing one cooling element 820A and elastic structures 890A. Cooling system 800A is analogous to cooling system 100. Cooling system 800 includes top plate 810 having vent 812, cooling element 820, orifice plate 830 including orifices 832, top chamber 840, bottom chamber 850 and anchor (i.e. support structure) 860 that are analogous to top plate 110 having vent 112, cooling element 120, orifice plate 130 including orifices 132, top chamber 140, bottom chamber 150 and anchor (i.e. support structure) 160, respectively. Thus, cooling element 820A is centrally supported by anchor 860 such that at least a portion of the perimeter of cooling element 820A is free to vibrate. In some embodiments, anchor 860 extends along the axis of cooling element 820A (e.g. in a manner analogous to anchor 260A and/or 260B). Further, orifice plate 830, orifices 832 and/or cooling element 820A may be configured in an analogous manner to one or more of the other orifice plate(s) and/or cooling element(s) depicted herein.

Also shown in FIG. 8A are piezoelectric 823 for cooling element 820A and elastic structure 890A. Elastic structure 890A resides between cooling element 820A and top plate 810. Elastic structure 890A is utilized to couple the vibrational motion of opposite sections of cooling element 820A. For example, if vibrating in phase (both sections undergoing an upstroke or both sections undergoing a down stroke), elastic structure 890A aids in maintaining the vibration of these portions of cooling element 820A in phase. For embodiments in which anchor 860 is only near the center portion of cooling element 820A (e.g. analogous to anchor 360A and/or 360B) elastic structure 890A may be configured differently.

Thus, cooling system 800A operates in a similar manner to cooling system 100. Consequently, the benefits of cooling system 100 may be achieved. Further, use of elastic structure 890A may allow the vibration of portions of cooling element 820A to be kept at the desired phase. Thus, performance of cooling system 800A may be further improved.

Figure 8B:
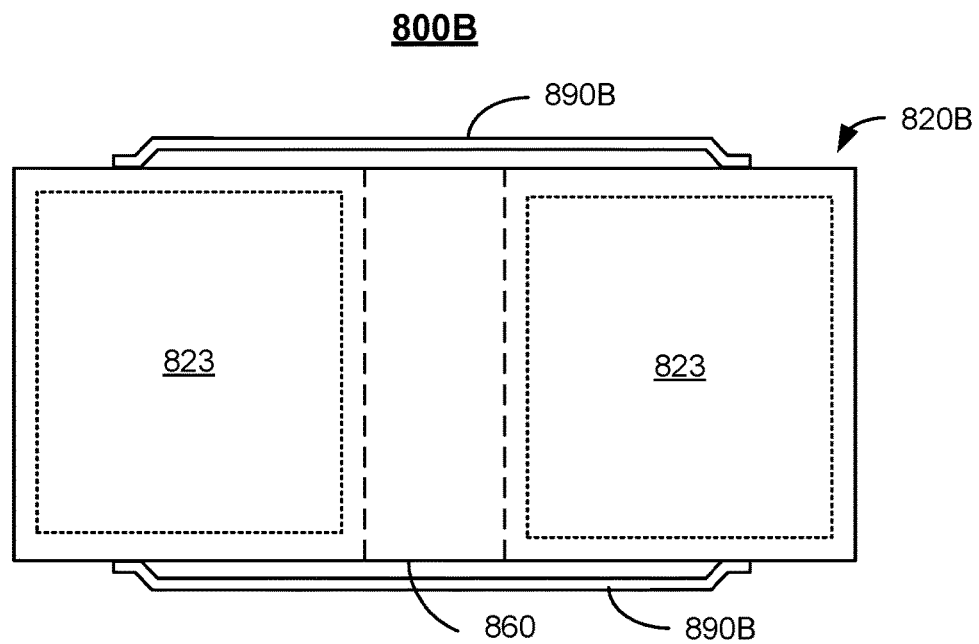

FIG. 8B depicts a plan view of a portion of cooling system 800B utilizing cooling element 820B and elastic structure 890B. Cooling system 800B is analogous to cooling system 100 and cooling system 800A. For simplicity, only cooling element 820B, elastic structures 890B and anchor 860 are shown. Elastic structure 890B resides at the sides of cooling element 820B. Elastic structure 890B is utilized to couple the vibrational motion of opposite sections of cooling element 820B. For example, if vibrating in phase (both sections undergoing an upstroke or both sections undergoing a down stroke), elastic structure 890B aids in maintaining the vibration of these portions of cooling element 820B in phase. For embodiments in which anchor 860 is only near the center portion of cooling element 820B (e.g. analogous to anchor 360A and/or 360B) elastic structure 890B may be configured differently.

Cooling system 800B operates in a similar manner to cooling system 100. Consequently, the benefits of cooling system 100 may be achieved. Further, use of elastic structure 890B may allow the vibration of portions of cooling element 820B to be kept at the desired phase. Thus, performance of cooling system 800B may be further improved.

Figure 8C:
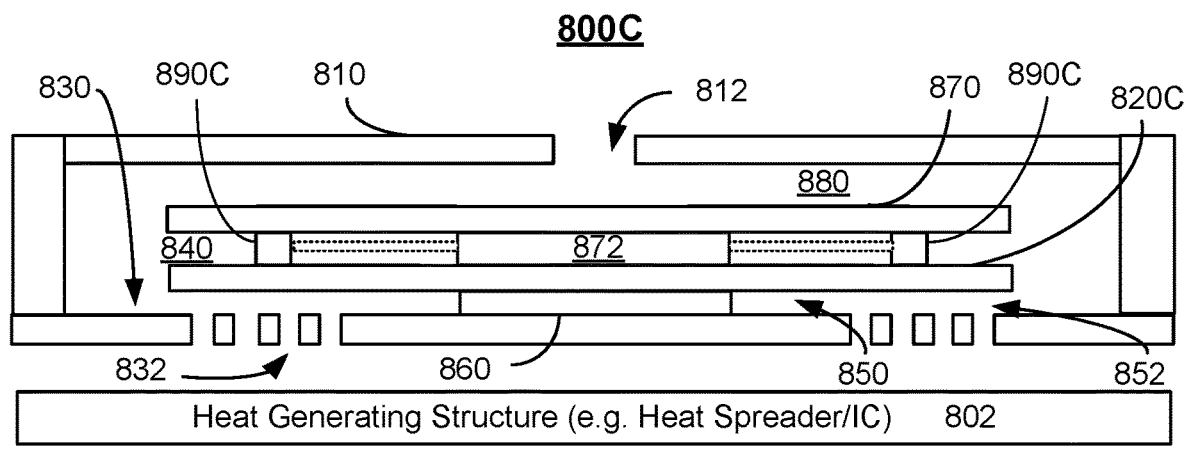

FIG. 8C depicts a neutral configuration of cooling system 800C including multiple cooling elements 820C and 870. Cooling system 800C is analogous to cooling system 100 and cooling system 700. Cooling system 800C includes top plate 810 having vent 812, cooling element 820C, orifice plate 830 including orifices 832, top chamber 840, bottom chamber 850 and anchor (i.e. support structure) 860 that are analogous to top plate 110 having vent 112, cooling element 120, orifice plate 130 including orifices 132, top chamber 140, bottom chamber 150 and anchor (i.e. support structure) 160, respectively. Cooling system 800C also includes additional cooling element 870, anchor (support structure) 872 and upper chamber 880 analogous to cooling element 770, anchor 772 and upper chamber 780, respectively. Thus, cooling elements 820C and 870 are centrally supported by anchors 860 and 872, respectively, such that at least a portion of the perimeter of cooling elements 820C and 870 are free to vibrate. In some embodiments, anchors 860 and 872 extend along the axis of cooling elements 820C and 870 (e.g. in a manner analogous to anchor 260A and/or 260B). Further, orifice plate 830, orifices 832 and/or cooling element 820C may be configured in an analogous manner to one or more of the other orifice plate(s) and/or cooling element(s) depicted herein.

Figure 8D:
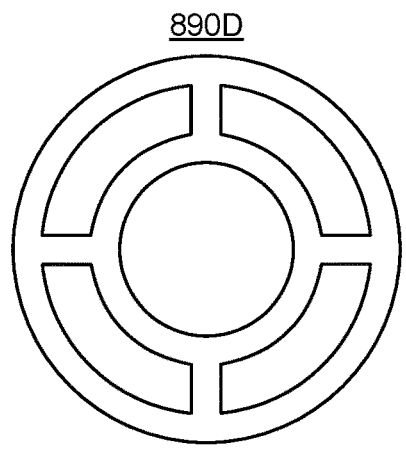
Figure 8E:
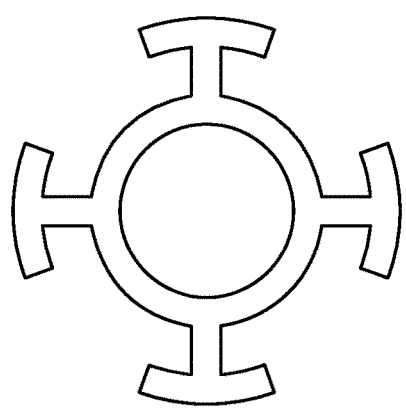

Also shown in FIG. 8C is elastic structure 890C. Elastic structure 890C resides between cooling elements 820C and 870. Elastic structure 890C is utilized to couple the vibrational motion of cooling elements 820C and 870. For example, if vibrating out-of-phase, elastic structure 890C aids in maintaining the phase of vibration of these cooling elements 820C and 870. FIGS. 8D and 8E depict embodiments of elastic structures 890D and 890E that may be used in cooling system 800C.

Thus, cooling system 800C operates in a similar manner to cooling system(s) 100 and/or 700. Consequently, the benefits of cooling system(s) 100 and/or 700 may be achieved. Further, use of elastic structure 890C, 890D and/or 890E may allow the vibration of cooling elements 820C and 870 to be kept at the desired phase. Thus, performance of cooling system 800C may be further improved. Further, cooling systems 800A, 800B and/or 800C may be usable in other applications (e.g. with or without heat-generating structure 802) in which high fluid flows and/or velocities are desired.

Figure 9A:
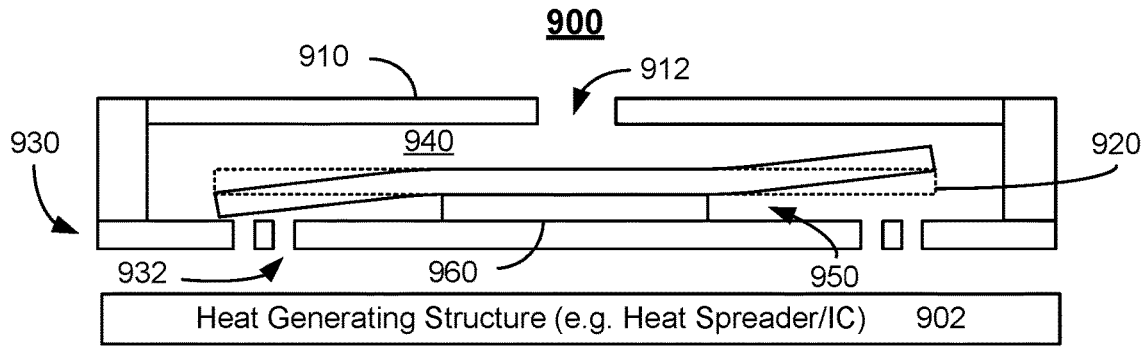
FIGS. 9A-9B depict an embodiment of an active cooling system including a centrally anchored cooling element driven out of phase.
Figure 9B:
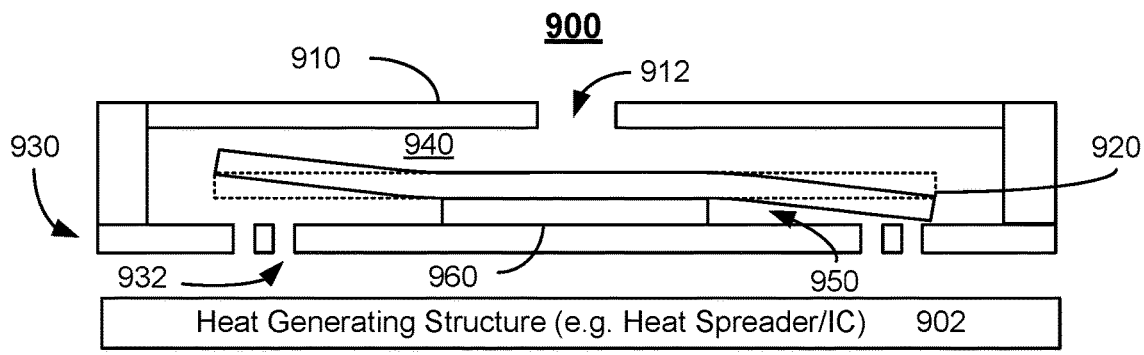

FIGS. 9A-9B depict an embodiment of active cooling system 900 including centrally anchored cooling element 920. FIGS. 9A-9B are not to scale. FIGS. 9A and 9B depict the end of the strokes of cooling element 920. The neutral configuration is denoted by dotted lines in FIGS. 9A and 9B. For simplicity, only portions of cooling system 900 are shown.

Cooling system 900 is analogous to cooling system 100. Cooling system 900 includes top plate 910 having vent 912, cooling element 920, orifice plate 930 including orifices 932, top chamber 940, bottom chamber 950 and anchor (i.e. support structure) 960 that are analogous to top plate 110 having vent 112, cooling element 120, orifice plate 130 including orifices 132, top chamber 140, bottom chamber 150 and anchor (i.e. support structure) 160, respectively. Thus, cooling element 920 is centrally supported by anchor 960 such that at least a portion of the perimeter of cooling element 920 is free to vibrate. In some embodiments, anchor 960 extends along the axis of cooling element 920 (e.g. in a manner analogous to anchor 260A and/or 260B). Further, orifice plate 930, orifices 932 and/or cooling element 920 may be configured in an analogous manner to one or more of the other orifice plate(s) and/or cooling element(s) depicted herein.

In the embodiment shown in FIGS. 9A-9B, cooling element 920 is driven out of phase. More specifically, sections of cooling element 920 on opposite sides of anchor 960 (and thus on opposite sides of the central region of cooling element 920 that is supported by anchor 960) are driven to vibrate out-of-phase. In some embodiments, sections of cooling element 920 on opposite sides of anchor 960 are driven at or near one hundred and eighty degrees out-of-phase. Thus, one section of cooling element 920 vibrates toward top plate 910, while the other section of cooling element 920 vibrates toward orifice plate 930/heat generating structure 902. Movement of a section of cooling element 920 toward top plate 910 (an upstroke) drives fluid in top cavity 940 to bottom cavity 950 on that side of anchor 960. Movement of a section of cooling element 920 toward orifice plate 930 drives fluid through orifices 932 and toward heat-generating structure 902. Thus, fluid traveling at high speeds (e.g. speeds described with respect to cooling system 100) is alternately driven out of orifices 932 on opposing sides of anchor 960.

Thus, cooling system 900 operates in a similar manner to cooling system 100. Consequently, the benefits of cooling system 100 may be attained. Further, out-of-phase vibration of cooling element 920 allows the position of the center of mass of cooling element 900 to remain more stable. Although a torque is exerted on cooling element 920, the force due to the motion of the center of mass is reduced or eliminated. As a result, vibrations due to the motion of cooling element 920 may be reduced. Moreover, efficiency of cooling system 900 may be improved through the use of out-of-phase vibrational motion for the two sides of cooling element 920. Thus, performance of cooling system 900 may be further improved. Further, cooling system 900 may be usable in other applications (e.g. with or without heat-generating structure 902) in which high fluid flows and/or velocities are desired.

Figure 10A:
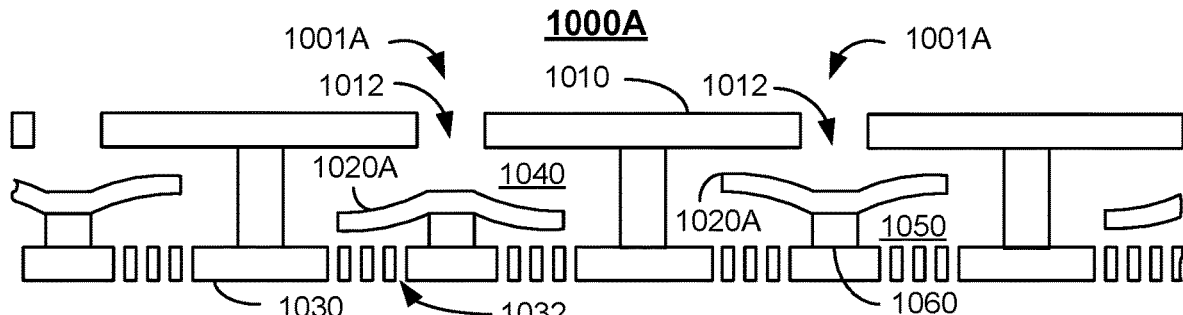
FIGS. 10A-10C depict an embodiment of an active cooling system including centrally anchored cooling elements.
Figure 10B:
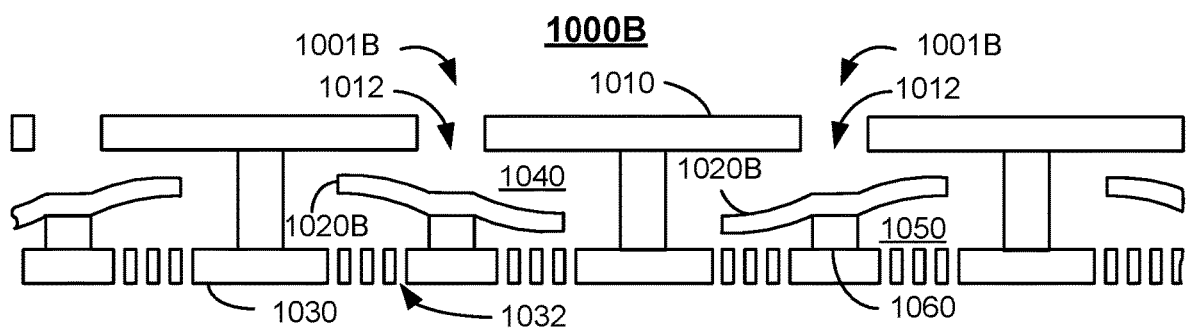
Figure 10C:
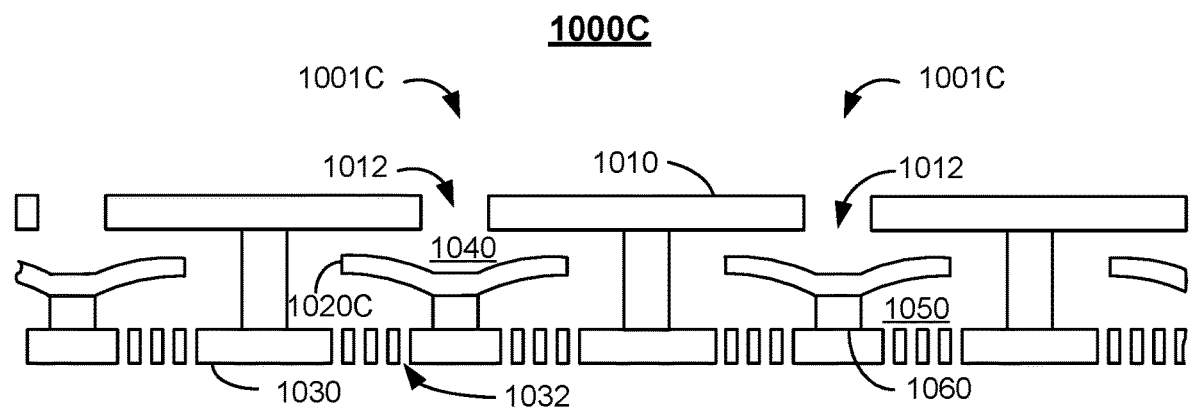

FIGS. 10A-10C depict embodiments of active cooling systems 1000A, 1000B and 1000C including multiple cooling cells 1001A, 1001B and 1001C, respectively. Each cooling cell 1001A, 1001B and 1001C has centrally anchored cooling element 1020A, 1020B and 1020C, respectively. FIGS. 10A-10C are not to scale. FIGS. 10A-10C depict the same geometric configuration, but in which cells 1001A, 1001B and 1001C are driven with various phases. Thus, although indicated as different systems, cooling systems 1000A, 1000B and 1000C may be the same physical system being driven by different input signals. For simplicity, only portions of cooling systems 1000A, 1000B and 1000C are shown.

Referring to FIG. 10A, each cell 1001A of cooling system 1000A is analogous to cooling system 100. Cooling system 1000A includes top plate 1010 having vents 1012, cooling elements 1020A, orifice plate 1030 including orifices 1032, top chamber 1040, bottom chamber 1050 and anchor (i.e. support structure) 1060 that are analogous to top plate 110 having vent 112, cooling element 120, orifice plate 130 including orifices 132, top chamber 140, bottom chamber 150 and anchor (i.e. support structure) 160, respectively. Thus, cooling element 1020A is centrally supported by anchor 1060 such that at least a portion of the perimeter of cooling element 1020A is free to vibrate. In some embodiments, anchor 1060 extends along the axis of cooling element 1020A (e.g. in a manner analogous to anchor 260A and/or 260B). In other embodiments, anchor 1060 is only near the center portion of cooling element 1020A (e.g. analogous to anchor 360A and/or 360B). Further, orifice plate 1030, orifices 1032 and/or cooling element 1020A may be configured in an analogous manner to one or more of the other orifice plate(s) and/or cooling element(s) depicted herein.

Each cooling element 1020A is driven such that it vibrates in phase. Thus, portions of cooling element 1020A not supported by anchor 1060 vibrate toward top plate 1010 together or toward orifice plate 1030 together. However, cooling elements 1020A in adjacent cells 1001A vibrate out of phase. Thus, if one cooling element 1020A is undergoing a down stroke, adjacent cooling elements 1020A are undergoing an upstroke.

Cooling cells 1001A of cooling system 1000A operate in a similar manner to cooling system 100. Consequently, the benefits of cooling system 100 may be achieved for each cooling cell 1001A. Use of multiple cells may increase the cooling power of cooling system 1000A. Further, out-of-phase vibration of cooling elements 1020A in adjacent cells may reduce vibrations in cooling system 1000A due to the motion of cooling elements 1020A. Thus, performance of cooling system 1000A may be further improved. Further, cooling system 1000A may be usable in other applications (e.g. with or without a heat-generating structure) in which high fluid flows and/or velocities are desired.

FIG. 10B depicts cooling system 1000B in which each cell 1001B is analogous to cooling systems 100 and 900. Cooling system 1000B includes top plate 1010 having vent 1012, cooling elements 1020B, orifice plate 1030 including orifices 1032, top chamber 1040, bottom chamber 1050 and anchor (i.e. support structure) 1060 that are analogous to top plate 110 having vent 112, cooling element 120, orifice plate 130 including orifices 132, top chamber 140, bottom chamber 150 and anchor (i.e. support structure) 160, respectively. Thus, cooling element 1020B is centrally supported by anchor 1060 such that at least a portion of the perimeter of cooling element 1020B is free to vibrate. In some embodiments, anchor 1060 extends along the axis of cooling element 1020B (e.g. in a manner analogous to anchor 260A and/or 260B). In other embodiments, anchor 1060 is only near the center portion of cooling element 1020B (e.g. analogous to anchor 360A and/or 360B). Further, orifice plate 1030, orifices 1032 and/or cooling element 1020B may be configured in an analogous manner to one or more of the other orifice plate(s) and/or cooling element(s) depicted herein.

Cooling element 1020B is driven such that it vibrates out of phase. Thus, some portions of cooling element 1020B not supported by anchor 1060 vibrate toward top plate 1010 together while other portions of cooling element 1020B vibrate toward orifice plate 1030. Further, in the embodiment shown, cooling elements 1020B in adjacent cells 1001B vibrate out of phase. In other embodiments, cooling elements 1020B in adjacent cells 1001B may vibrate in phase (e.g. the right portion of cooling element 1020B for all cells 1001B vibrate toward top plate 1010 together).

Cooling cells 1001B of cooling system 1000B operate in a similar manner to cooling systems 900 and 100. Consequently, the benefits of cooling systems 100 and 900 may be achieved for each cooling cell 1001B. Cooling system 1000B may have improved cooling power through the use of multiple cooling cells 1001B. Further, out-of-phase vibration of cooling elements 1020B in individual cells 1001B allows may reduce vibrations in cooling system 1000B due to the motion of cooling elements 1020B. Thus, performance of cooling system 1000B may be further improved. Further, cooling system 1000B may be usable in other applications (e.g. with or without a heat-generating structure) in which high fluid flows and/or velocities are desired.

Referring to FIG. 10C depicts cooling system 1000C in which each cell 1001C is analogous to cooling system 100. Cooling system 1000C includes top plate 1010 having vent 1012, cooling elements 1020C, orifice plate 1030 including orifices 1032, top chamber 1040, bottom chamber 1050 and anchor (i.e. support structure) 1060 that are analogous to top plate 110 having vent 112, cooling element 120, orifice plate 130 including orifices 132, top chamber 140, bottom chamber 150 and anchor (i.e. support structure) 160, respectively. Thus, cooling element 1020C is centrally supported by anchor 1060 such that at least a portion of the perimeter of cooling element 1020C is free to vibrate. In some embodiments, anchor 1060 extends along the axis of cooling element 1020C (e.g. in a manner analogous to anchor 260A and/or 260B). In other embodiments, anchor 1060 is only near the center portion of cooling element 1020C (e.g. analogous to anchor 360A and/or 360B). Further, orifice plate 1030, orifices 1032 and/or cooling element 1020C may be configured in an analogous manner to one or more of the other orifice plate(s) and/or cooling element(s) depicted herein.

Cooling element 1020C is driven such that it vibrates in phase. Thus, portions of cooling element 1020C not supported by anchor 1060 vibrate toward top plate 1010 together or toward orifice plate 1030 together. Further, cooling elements 1020C in adjacent cells 1001C vibrate in phase. Thus, the cooling element 1020C in all cells 10001C undergo down strokes and upstrokes together.

Thus, cooling cells 1001C of cooling system 1000C operate in a similar manner to cooling system 100. Consequently, the benefits of cooling system 100 may be achieved for each cooling cell 1001C. Use of multiple cooling cells 1001C may further increase the cooling power of cooling system 1000. Thus, performance of cooling system 1000A may be further improved. However, in-phase vibration of cooling elements 1020C in adjacent cells may allow an increase in vibrations in cooling system 1000C due to the motion of cooling elements 1020A. Cooling system 1000C may also be usable in other applications (e.g. with or without a heat-generating structure) in which high fluid flows and/or velocities are desired.

FIGS. 11A-11D depict embodiments of active cooling systems 1100 and 1100D including multiple cooling elements 1110 and 1120. FIGS. 11A-11D are not to scale. FIGS. 11A-11D depict the same geometric configuration, but in which the cooling elements are driven in different manners.

Figure 11A:
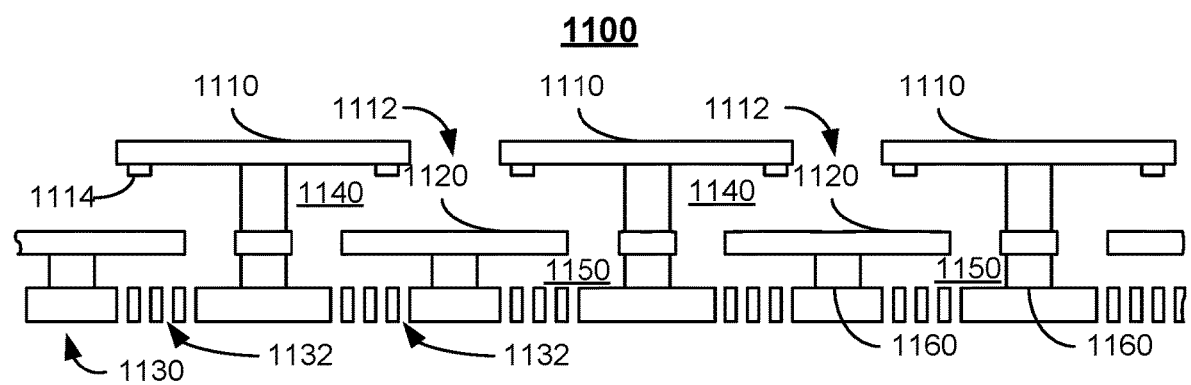
FIGS. 11A-11D depict an embodiment of a cooling system including stacked centrally anchored cooling elements.

FIG. 11A depicts a neutral configuration of cooling system 1100 having multiple centrally anchored cooling elements 1110 and 1120. Cooling system 1100 is analogous to cooling system 700 but has staggered cooling element 1110 and 1120. Cooling system 1100 includes cooling elements 1120 and 1110, orifice plate 1130 including orifices 1132, top chamber 1140, bottom chamber 1150 and anchor (i.e. support structure) 1160 that are analogous to cooling element 120 (and cooling elements 720 and 770), orifice plate 130 including orifices 132, top chamber 140, bottom chamber 150 and anchor (i.e. support structure) 160, respectively. Also shown are top ledges 1114 analogous to top ledges 422E and 422D. In some embodiments, top ledges 1114 may be omitted. Thus, each cooling element 1120 and 1110 is centrally supported by an anchor 1160 such that at least a portion of the perimeter of cooling element 1120 and 1110 is free to vibrate. In some embodiments, anchor 1160 extends along the axis of cooling elements 1110 and/or 1120 (e.g. in a manner analogous to anchor 260A and/or 260B). In other embodiments, anchor 1160 is only near the center portion of cooling element 1110 and/or 1120 (e.g. analogous to anchor 360A and/or 360B). Further, orifice plate 1130, orifices 1132 and/or cooling elements 1110 and 1120 may be configured in an analogous manner to one or more of the other orifice plate(s) and/or cooling element(s) depicted herein.

Figure 11B:
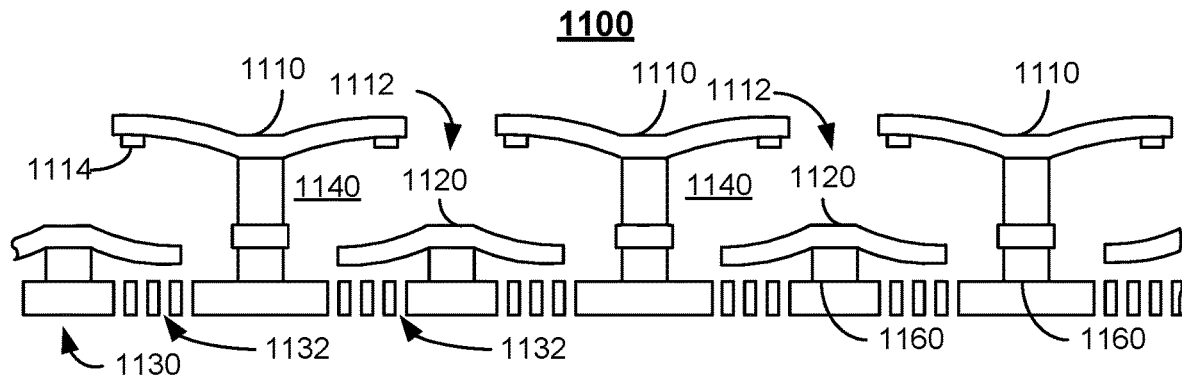
Figure 11C:
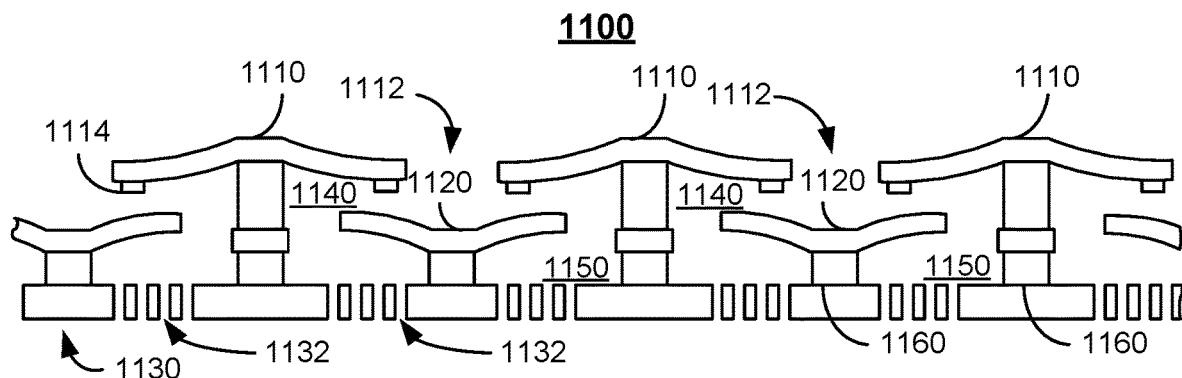
Figure 11D:
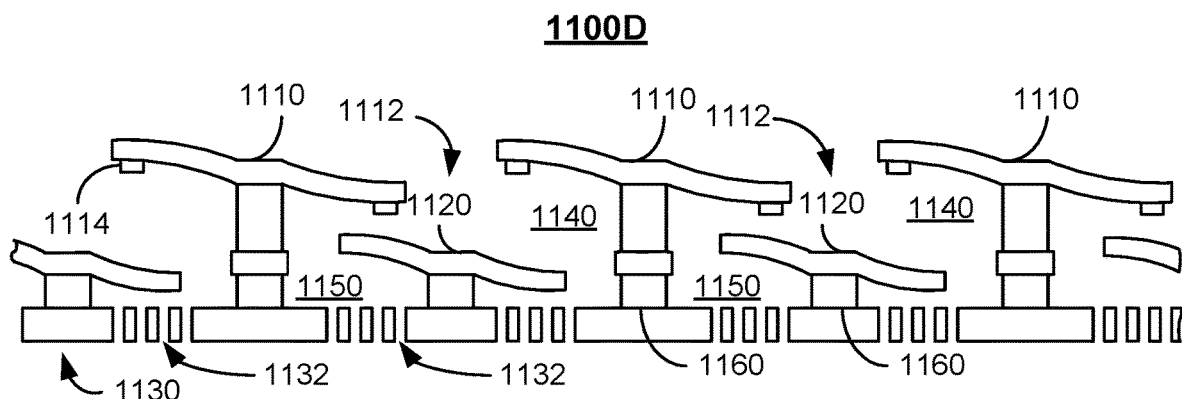

FIGS. 11B-11C depict cooling system 1100 when each cooling element 1110 and 1120 is driven such that it vibrates in phase. Thus, portions of each cooling element 1120 not supported by anchor 1160 vibrate away from orifice plate 1130 together or toward orifice plate 1130 together. Similarly, portions of cooling element 1110 not supported by anchor 1160 vibrate away from orifice plate 1130 together or toward orifice plate 1130 together. However, adjacent cooling elements 1110 and 1120 vibrate out of phase. Thus, if one cooling element 1120 is undergoing a down stroke, adjacent cooling elements 1110 are undergoing an upstroke and vice versa. Alternatively, cooling system 1100D depicts the case in which each cooling element 1110 and 1120 is driven out of phase. Thus, some portions of cooling element 1110 and cooling element 1120 not supported by anchor 1060 vibrate away from orifice plate 130 together while other portions of cooling element 1110 and 1120, respectively, vibrate toward orifice plate 1130. Thus, depending upon how cooling elements 1110 and 1120 are actuated, in-phase or out-of-phase vibrations may be used.

Cooling system 1100/1100D operates in a similar manner to cooling system 100. Consequently, the benefits of cooling system 100 may be achieved. Use of multiple cooling elements may increase the cooling power of cooling system 1100/1100D. Further, stacking cooling elements 1110 and 1120 may allow for a higher back pressure to be supported. Thus, performance of cooling system 1100/1100D may be further improved. Further, cooling systems 1100 and/or 1100D may be usable in other applications (e.g. with or without a heat-generating structure) in which high fluid flows and/or velocities are desired.

Figure 12:
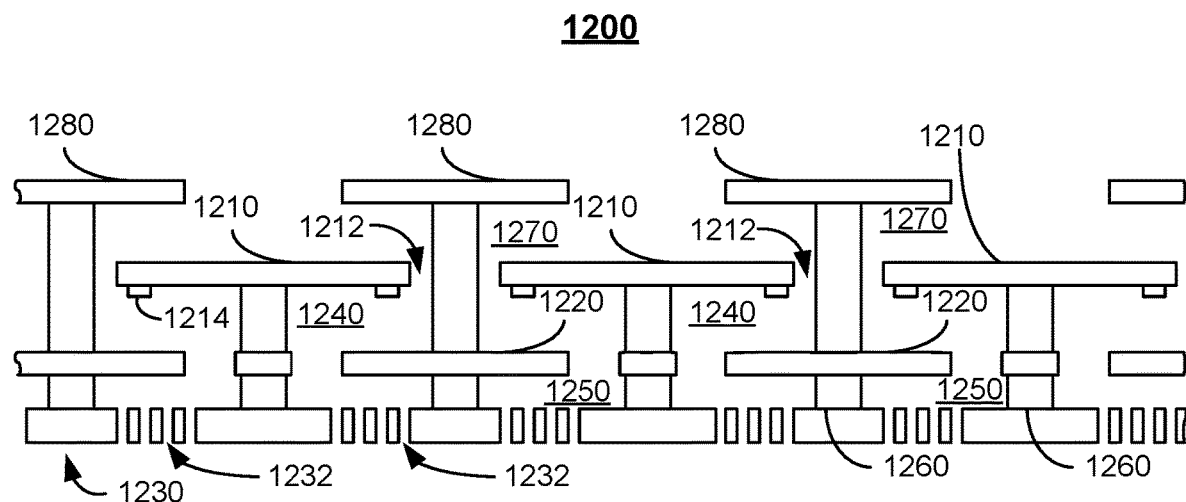
FIG. 12 depicts an embodiment of a cooling system including stacked centrally anchored cooling elements.

FIG. 12 depicts an embodiment of active cooling systems 200 including multiple cooling elements 1210, 1220 and 1280. FIG. 12 is not to scale. Cooling system 1200 is analogous to cooling systems 700 and 1100. Cooling system 1200 includes cooling elements 1220 and 1210, orifice plate 1230 including orifices 1232, top chamber 1240, bottom chamber 1250 and anchor (i.e. support structure) 1260 that are analogous to cooling element 120 (and cooling elements 710 and 770), orifice plate 130 including orifices 132, top chamber 140, bottom chamber 150 and anchor (i.e. support structure) 160, respectively. Also shown are top ledges 1214 analogous to ledges 422E and 422D. In some embodiments, top ledges 1214 may be omitted.

Cooling elements 1220 and 1210 are each centrally supported by an anchor 1260 such that at least a portion of the perimeter of cooling element 1220 and/or 1210 is free to vibrate. In some embodiments, anchor 1260 extends along the axis of cooling elements 1210 and 1220 (e.g. in a manner analogous to anchor 260A and/or 260B). In other embodiments, anchor 1260 is only near the center portion of cooling element 1210 and/or 1220 (e.g. analogous to anchor 360A and/or 360B). Further, orifice plate 1230, orifices 1232 and/or cooling elements 1210, 1220 and 1280 may be configured in an analogous manner to one or more of the other orifice plate(s) and/or cooling element(s) depicted herein.

In addition, cooling system 1200 has an additional layer of cooling elements 1280 and upper chambers 1270. Cooling elements 1280 function in a manner analogous to cooling elements 1210 and/or 1220. Further, cooling elements 1210, 1220 and 1280 may be driven in phase or out-of-phase.

Thus, cooling system 1200 operates in a similar manner to cooling system 100. Consequently, the benefits of cooling system 100 may be achieved. Use of multiple cooling elements may increase the cooling power of cooling system 1200. Further, stacking cooling elements 1210, 1220 and 1280 may allow for a higher back pressure to be supported. Thus, performance of cooling system 1200 may be further improved. Further, cooling system 1200 may be usable in other applications (e.g. with or without a heat-generating structure) in which high fluid flows and/or velocities are desired.

Figure 13:
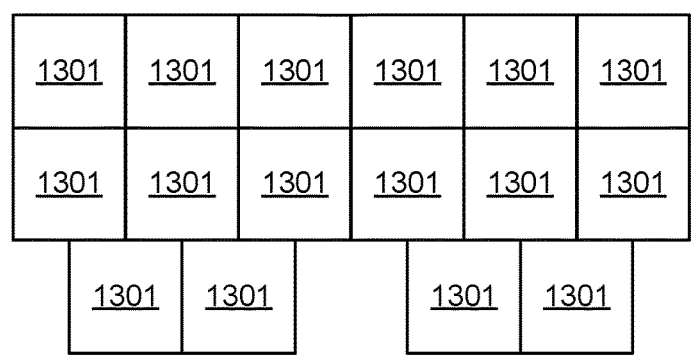
FIG. 13 depicts a top view of an embodiment of a cooling system including multiple cooling cells.

FIG. 13 depicts a top view of an embodiment of cooling system 1300 including multiple cooling cells 1301. FIG. 13 is not to scale. Cooling cells 1301 are analogous to one or more of the cooling systems described herein, such as cooling systems 100, 400A, 400B, 400C, 400D, 400E, 500, 600, 700, 800A, 800B, 800C, 900, 1000A, 1000B, 1000C, 1100, 1100D and/or 1200. As indicated in cooling system 1300, cooling cells 1301 may be arranged in a two-dimensional array of the desired size and configuration. Thus, the configuration of cooling cells 1301 may be adapted to the desired application. Further, cooling system 1300 may be usable in other applications (e.g. with or without a heat-generating structure) in which high fluid flows and/or velocities are desired.

Figure 14A:
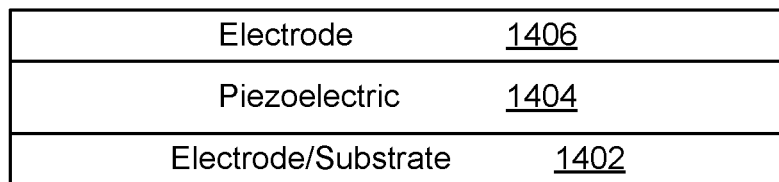
FIGS. 14A-14B depict embodiments of piezoelectric cooling elements.
Figure 14B:
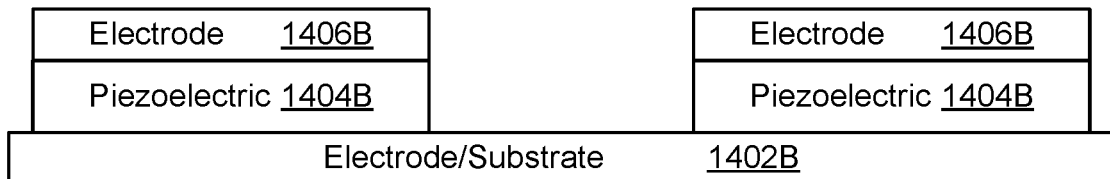

FIGS. 14A-14B depict embodiments of cooling elements 1400A and 1400B, respectively. FIGS. 14A and 14B are not to scale. Cooling elements 1400A and 1400B are piezoelectric cooling elements that may be used as or included in the cooling elements described herein. Referring to FIG. 14A, cooling element 1400A includes a piezoelectric layer 1404 on substrate 1402. In some embodiments, substrate 1402 includes stainless steel, Ni and/or Hastelloy. In some embodiments, piezoelectric layer 1404 includes multiple sublayers. In some embodiments, piezoelectric layer 1404 is fabricated on substrate 1402 using deposition techniques. In some embodiments, piezoelectric layer 1404 includes or is a bulk layer affixed to substrate 1402. Piezoelectric cooling element 1400A also includes top electrode 1406. In some embodiments, a bottom electrode may be formed by stainless steel substrate 1402. In other embodiments, a bottom electrode (not shown) may be provided between substrate 1402 and piezoelectric layer 1404. Other layers (not shown) including but not limited to seed, capping, passivation or other layers might be included in piezoelectric cooling element 1400. The thickness and width of cooling element 1400A may be within the ranges described for other cooling elements discussed herein.

FIG. 14B depicts piezoelectric cooling element 1400B that is analogous to cooling element 1400A. Piezoelectric element 1400B includes piezoelectric layers 1404B on substrate 1402B. In some embodiments, substrate 1402B includes stainless steel, Ni and/or Hastelloy. In some embodiments, each piezoelectric layer 1404B includes multiple sublayers. In some embodiments, each piezoelectric layer 1404B is fabricated on substrate 1402B using deposition techniques. In some embodiments, each piezoelectric layer 1404B includes or is a bulk layer affixed to substrate 1402B. Piezoelectric cooling element 1400B also includes top electrode 1406B for each piezoelectric layer 1404B. Thus, portions of piezoelectric cooling element 1400B may be separately actuated. In some embodiments, a bottom electrode may be formed by substrate 1402B. In other embodiments, a bottom electrode (not shown) may be provided between substrate 1402B and piezoelectric layer 1404B. Other layers (not shown) including but not limited to seed, capping, passivation or other layers might be included in piezoelectric cooling element 1400B. The thickness and width of cooling element 1400B may be within the ranges described for other cooling elements discussed herein.

Figure 15:
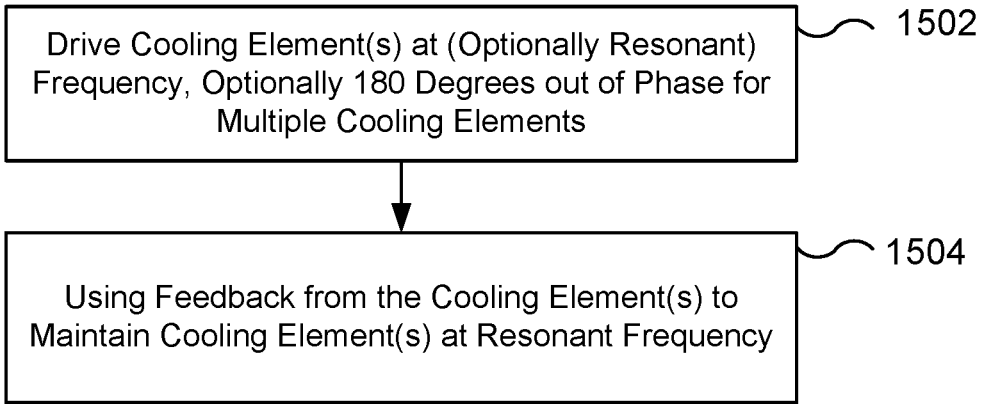
FIG. 15 is a flow chart depicting an embodiment of a technique for driving an active cooling element.

FIG. 15 is a flow chart depicting an exemplary embodiment of method 1500 for operating a cooling system. Method 1500 may include steps that are not depicted for simplicity. Method 1500 is described in the context of piezoelectric cooling system 100. However, method 1500 may be used with other cooling systems including but not limited to systems and cells described herein.

One or more of the cooling element(s) in a cooling system is actuated to vibrate, at 1502. At 1502, an electrical signal having the desired frequency is used to drive the cooling element(s). In some embodiments, the cooling elements are driven at or near structural and/or acoustic resonant frequencies at 1502. The driving frequency may be 15 kHz or higher. If multiple cooling elements are driven at 1502, the cooling elements may be driven out-of-phase. In some embodiments, the cooling elements are driven substantially at one hundred and eighty degrees out of phase. Further, in some embodiments, individual cooling elements are driven out-of-phase. For example, different portions of a cooling element may be driven to vibrate in opposite directions.

Feedback from the piezoelectric cooling element(s) is used to adjust the driving current, at 1504. In some embodiments, the adjustment is used to maintain the frequency at or near the acoustic and/or structural resonant frequency/frequencies of the cooling element(s) and/or cooling system. Resonant frequency of a particular cooling element may drift, for example due to changes in temperature. Adjustments made at 1504 allow the drift in resonant frequency to be accounted for.

For example, piezoelectric cooling element 120 may be driven at its structural resonant frequency/frequencies, at 1502. This resonant frequency may also be at or near the acoustic resonant frequency for top chamber 140. At 1504, feedback is used to maintain cooling element 120 at resonance and, in some embodiments in which multiple cooling elements are driven, one hundred and eighty degrees out of phase. Thus, the efficiency of cooling element 120 in driving fluid flow through cooling system 100 and onto heat-generating structure 102 may be maintained. In some embodiments, 1504 includes sampling the current through cooling element 120 and adjusting the current to maintain resonance and low input power.

In another example, piezoelectric cooling elements 720 and 770 may be driven at their structural resonant frequency/frequencies, at 1502. These structural resonant frequencies may also be at or near the acoustic resonant frequency for top chamber 740. Because multiple cooling elements 720 and 770 are driven, there may be small differences in the resonant frequencies and thus the driving frequencies. Thus, cooling elements 720 and 770 may be driven at slightly different frequencies. Further, cooling elements 720 and 770 are actuated to vibrate out of phase (e.g. one hundred and eighty degrees out of phase).

At 1504, feedback is used to maintain cooling elements 720 and 770 at resonance and, in some embodiments, one hundred and eighty degrees out of phase. For example, the driving currents may be sampled and adjusted to reduce the power input for the same magnitude of deflection or fluid flow. The reduction in power occurs at resonance. Using feedback, cooling elements 720 and 770 may be kept at or near resonance. Thus, the efficiency of cooling elements 720 and 770 in driving fluid flow through cooling system 700 and onto heat-generating structure 702 may be maintained.

Consequently, cooling elements, such as cooling element(s) 120, 720 and/or 770, may operate as described above. Method 1500 thus provides for use of piezoelectric cooling systems described herein. Thus, piezoelectric cooling systems may more efficiently and quietly cool semiconductor devices at lower power.

Figure 16:
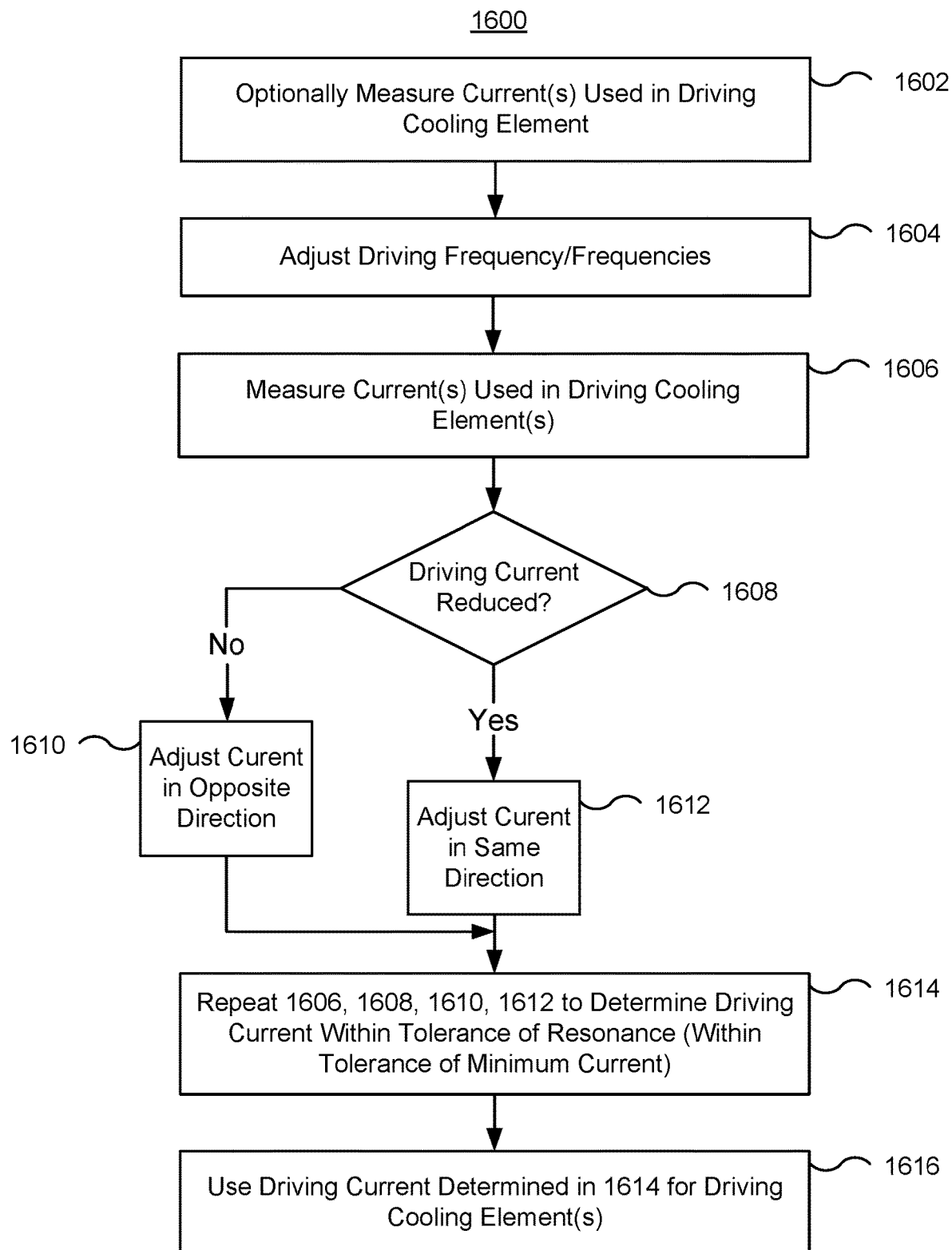
FIG. 16 is a flow chart depicting an embodiment of a technique for driving an active cooling element.

FIG. 16 is a flow chart depicting an exemplary embodiment of method 1600 for operating a cooling system. Method 1600 may include steps that are not depicted for simplicity. Method 1600 is described in the context of piezoelectric cooling system 100. However, method 1600 may be used with other cooling systems including but not limited to systems and cells described herein. Method 1600 commences after driving current(s) have been provided to actuate one or more cooling elements. Thus, electrical signal(s) having the desired frequencies are used to drive the cooling element(s). In some embodiments, the cooling elements are driven at or near the structural and acoustic resonant frequencies.

The current(s) used in driving the cooling element(s) are measured, at 1602. The driving frequencies for the current(s) are adjusted, at 1604. For example, the driving current frequencies may be increased at 1604. Further, the currents may be adjusted to maintain the same flow rate or amplitude of deflection after the change in frequency. The new currents used to drive the cooling element(s) are measured, at 1606.

It is determined whether the driving current has been reduced in response to the change in driving frequency, at 1608. If not, the frequency of the driving current is adjusted in the opposite direction, at 1610. If the driving current has been reduced, then the current is adjusted in the same direction, at 1612.

Processes 1606, 1608, 1610 and/or 1612 are iteratively repeated until the measured current indicates that the driving frequencies for the cooling element(s) are within tolerances of the structural and/or acoustic resonant frequencies, at 1614. Thus, the processes are repeated until the measured current is within tolerances of a minimum driving current. This current is used in driving the cooling element(s), at 1616.

For example, piezoelectric cooling element 120 may be driven at or near its structural resonant frequency. Over time, the structural and/or acoustic resonant frequencies for cooling system 100 may drift. Thus, the current used to drive cooling element 120 is measured, at 1602. The frequency of the driving signal may be adjusted, at 1604. The magnitude of the current used in the driving signal is also adjusted to provide the desired flow rate and/or cooling element deflection. The current used to drive cooling element 120 at the new frequency with the desired amplitude is measured, at 1606. It is determined whether the driving current has reduced, at 1608. If the new driving frequency is further from the (drifted) structural/acoustic resonant frequencies than the prior driving frequency, then the driving current is increased. If the new driving frequency is closer to the (drifted) structural/acoustic resonant frequencies, then the driving current is decreased. Thus, based on the determination in 1606, the frequency of the driving signal is adjusted in the same direction at 1612 or in the opposite direction at 1610. The measuring (1606), difference determining (1608) and adjusting (1610 or 1612) are iteratively repeated until cooling element 120 is driven with the desired tolerances of the structural and/or acoustic resonant frequency, at 1614 and 1616.

Consequently, cooling elements, such as element 120, may operate as described above. Method 1600 thus provides for use of piezoelectric cooling systems described herein. Thus, piezoelectric cooling systems may more efficiently and quietly cool semiconductor devices at lower power.

Various configurations, methods and features have been described herein. Some or all of the configurations, methods and/or features may be combined in manners not explicitly described here.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A cooling system, comprising:
a top plate having at least one vent therein;
a support structure;
a cooling element having a first cantilevered region, a second cantilevered region, a central region between the first cantilevered region and the second cantilevered region, and a perimeter, the cooling element being supported by the support structure at the central region, at least a portion of the perimeter being unpinned, the cooling element being between the top plate and a heat-generating structure, forming a top chamber between the cooling element and the top plate; and
an orifice plate having at least one orifice therein, the orifice plate being between the cooling element and the heat-generating structure, the cooling element being between the orifice plate and the top plate, the cooling element configured to undergo vibrational motion of the first cantilevered region and the second cantilevered region when actuated to draw a fluid into the at least one vent, direct the fluid through the top chamber, and drive the fluid through the at least one orifice and toward the heat-generating structure.

2. The cooling system of claim 1, wherein the cooling element has a first side proximate to the heat-generating structure and a second side distal from the heat-generating structure, the vibrational motion driving the fluid from the second side to the first side of the cooling element.

3. The cooling system of claim 1, wherein the at least one orifice is located at least one hundred micrometers from the perimeter and not more than one millimeter from the perimeter.

4. The cooling system of claim 1, wherein the orifice plate includes at least one of a ledge and at least one trench therein, the at least one trench including the at least one orifice therein, the ledge being closer the perimeter of the cooling element than the at least one orifice is.

5. The cooling system of claim 1, wherein the vibrational motion is out-of-phase vibrational motion.

6. The cooling system of claim 5, wherein a first portion of the cooling element on a first side of the central region and a second portion of the cooling element on a second side of the central region vibrate, the second side being opposite to the first side, the first portion and the second portion of the cooling element undergoing out-of-phase vibrational motion.

7. The cooling system of claim 1, further comprising:
an elastic structure coupled to the cooling element.

8. The cooling system of claim 1, further comprising:
an additional cooling element, the cooling element being between the additional cooling element and the heat-generating structure.

9. The cooling system of claim 1, wherein the cooling element is a piezoelectric cooling element having a length not exceeding ten millimeters and wherein the vibrational motion drives the fluid toward the heat-generating structure with a speed of at least thirty meters per second.

10. The cooling system of claim 1, wherein the vibrational motion drives the fluid from the at least one orifice at a speed of at least thirty meters per second.

11. The cooling system of claim 1, wherein the cooling system has a height of not more than 1.5 millimeters.

12. A cooling system, comprising
a support structure;
a cooling element having a central region and a perimeter, the cooling element being supported by the support structure at the central region, at least a portion of the perimeter being unpinned, the cooling element being configured to undergo vibrational motion when actuated to drive a fluid toward a heat-generating structure;
a top plate having at least one vent therein, the cooling element being between the top plate and the heat-generating structure, forming a top chamber between the cooling element and the top plate
wherein the top chamber has a length corresponding to an odd integer multiplied by a wavelength divided by four, the wavelength being an acoustic wavelength for a frequency of the vibrational motion, the frequency of the vibrational motion corresponding to a structural resonance for the cooling element and to an acoustic resonance for the top chamber, the wavelength and the frequency corresponding to the acoustic resonance.

13. The cooling system of claim 12, wherein the top chamber is a folded top chamber.

14. A method of cooling a heat-generating structure, comprising:
driving a cooling element of an active cooling cell to induce a vibrational motion at a frequency, the active cooling cell including a top plate having at least one vent therein, the cooling element, a support structure, and an orifice plate having at least one orifice therein, the cooling element having a first cantilevered region, a second cantilevered region, a central region between the first cantilevered region and the second cantilevered region, and a perimeter, the cooling element being supported by the support structure at the central region, at least a portion of the perimeter being unpinned, the cooling element being between the top plate and a heat-generating structure, forming a top chamber between the cooling element and the top plate, the orifice plate being between the cooling element and the heat-generating structure, the cooling element being between the orifice plate and the top plate, the cooling element being configured to undergo vibrational motion of the first cantilevered region and the second cantilevered region when actuated to draw a fluid into the at least one vent, direct the fluid through the top chamber, and drive the fluid through the at least one orifice and toward a heat-generating structure.

15. A method of cooling a heat-generating structure, comprising:
driving a cooling element to induce a vibrational motion at a frequency, the cooling element having a central region and a perimeter, the cooling element being supported by a support structure at the central region, at least a portion of the perimeter being unpinned, the cooling element being configured to undergo vibrational motion when actuated to drive a fluid toward a heat-generating structure,
wherein the frequency corresponds to a structural resonance for the cooling element, the cooling element being between a top plate and the heat-generating structure, the top plate having at least one vent therein, the cooling element and the top plate forming a top chamber between the cooling element and the top plate, the top chamber having a length, the frequency also corresponding to an acoustic resonance having a wavelength corresponding to the length of the top chamber multiplied by four and divided by an odd integer.

* * * * *